United States Patent
Yamada et al.

(10) Patent No.: US 9,129,871 B2
(45) Date of Patent: Sep. 8, 2015

(54) RADIOACTIVE-RAY IMAGING APPARATUS, RADIOACTIVE-RAY IMAGING DISPLAY SYSTEM AND TRANSISTOR

(71) Applicant: Sony Corporation, Tokyo (JP)

(72) Inventors: Yasuhiro Yamada, Kanagawa (JP); Ryoichi Ito, Aichi (JP); Tsutomu Tanaka, Kanagawa (JP); Makoto Takatoku, Kanagawa (JP); Michiru Senda, Kanagawa (JP)

(73) Assignee: SONY CORPORATION (JP)

( * ) Notice: Subject to any disclaimer, the term of this patent is extended or adjusted under 35 U.S.C. 154(b) by 0 days.

(21) Appl. No.: 13/886,994

(22) Filed: May 3, 2013

(65) Prior Publication Data

US 2013/0234219 A1  Sep. 12, 2013

Related U.S. Application Data

(62) Division of application No. 13/485,485, filed on May 31, 2012.

(30) Foreign Application Priority Data

Jun. 7, 2011   (JP) ................................. 2011-127598
Jan. 6, 2012   (JP) ................................. 2012-000956

(51) Int. Cl.
  *H01L 27/14*   (2006.01)
  *H01L 27/146*   (2006.01)
  *H01L 29/786*   (2006.01)
  *H01L 29/78*   (2006.01)

(52) U.S. Cl.
  CPC ........ *H01L 27/146* (2013.01); *H01L 27/14623* (2013.01); *H01L 27/14632* (2013.01); *H01L 27/14663* (2013.01); *H01L 27/14676* (2013.01); *H01L 29/7831* (2013.01); *H01L 29/78633* (2013.01); *H01L 27/14643* (2013.01)

(58) Field of Classification Search
  CPC .......................... H01L 27/3272; H01L 27/146
  USPC ............. 257/53, 66, 292, E29.273, E31.124, 257/E31.73, 428; 313/504; 445/46; 250/208.1, 370.09; 348/308
  See application file for complete search history.

(56) References Cited

U.S. PATENT DOCUMENTS 5,155,608 A * 10/1992 Hatano ........................... 349/76
6,225,632 B1 * 5/2001 Kinno et al. ............. 250/370.09
(Continued)

FOREIGN PATENT DOCUMENTS

JP  2004-265935 A   9/2004
JP  2008-252074 A   10/2008

*Primary Examiner* — Thao X Le
*Assistant Examiner* — Gardner W Swan
(74) *Attorney, Agent, or Firm* — Sheridan Ross P.C.

(57) ABSTRACT

Disclosed herein is a transistor including: a semiconductor layer; a first gate insulation film and a first interlayer insulation film which are provided on a specific surface side of the semiconductor layer; a first gate electrode provided at a location between the first gate insulation film and the first interlayer insulation film; an insulation film provided on the other surface side of the semiconductor layer; source and drain electrodes provided by being electrically connected to the semiconductor layer; and a shield electrode layer provided in such a way that at least portions of the shield electrode layer face edges of the first gate electrode, wherein at least one of the first gate insulation film, the first interlayer insulation film and the insulation film include a silicon-oxide film.

13 Claims, 27 Drawing Sheets

(56) References Cited

U.S. PATENT DOCUMENTS

| | | | |
|---|---|---|---|
| 6,372,558 B1 * | 4/2002 | Yamanaka et al. | 438/149 |
| 6,806,472 B2 * | 10/2004 | Yoon et al. | 250/370.09 |
| 7,190,420 B2 * | 3/2007 | Zhang | 349/44 |
| 7,474,045 B2 * | 1/2009 | Hamada et al. | 313/498 |
| 7,531,839 B2 * | 5/2009 | Hamada et al. | 257/72 |
| 8,154,641 B2 * | 4/2012 | Nomura et al. | 348/308 |
| 2002/0004262 A1 * | 1/2002 | Asami et al. | 438/166 |
| 2006/0110863 A1 * | 5/2006 | Yamamoto et al. | 438/149 |
| 2007/0004110 A1 * | 1/2007 | Tanaka | 438/166 |
| 2009/0084938 A1 * | 4/2009 | Okada | 250/208.1 |
| 2009/0091254 A1 * | 4/2009 | Jeong et al. | 313/504 |
| 2009/0206332 A1 * | 8/2009 | Son et al. | 257/43 |
| 2009/0250699 A1 * | 10/2009 | Okada | 257/53 |

* cited by examiner

LIGHT QUANTITY AND Vth SHIFT
(WITH Ids = 1e-11 (A) TAKEN AS A REFERENCE)

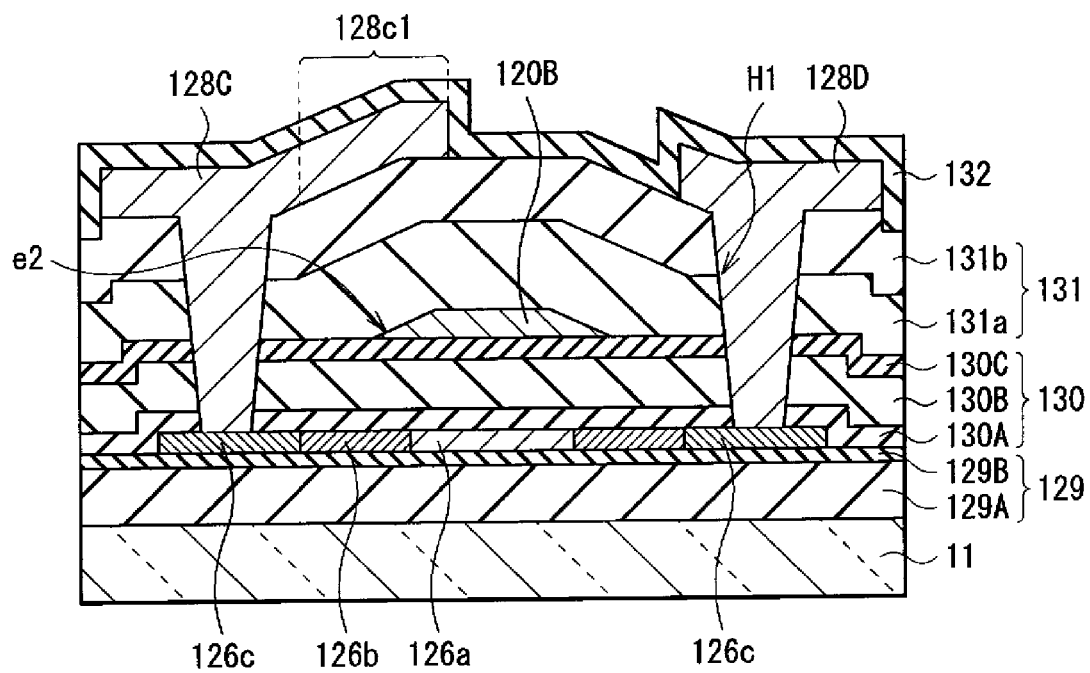
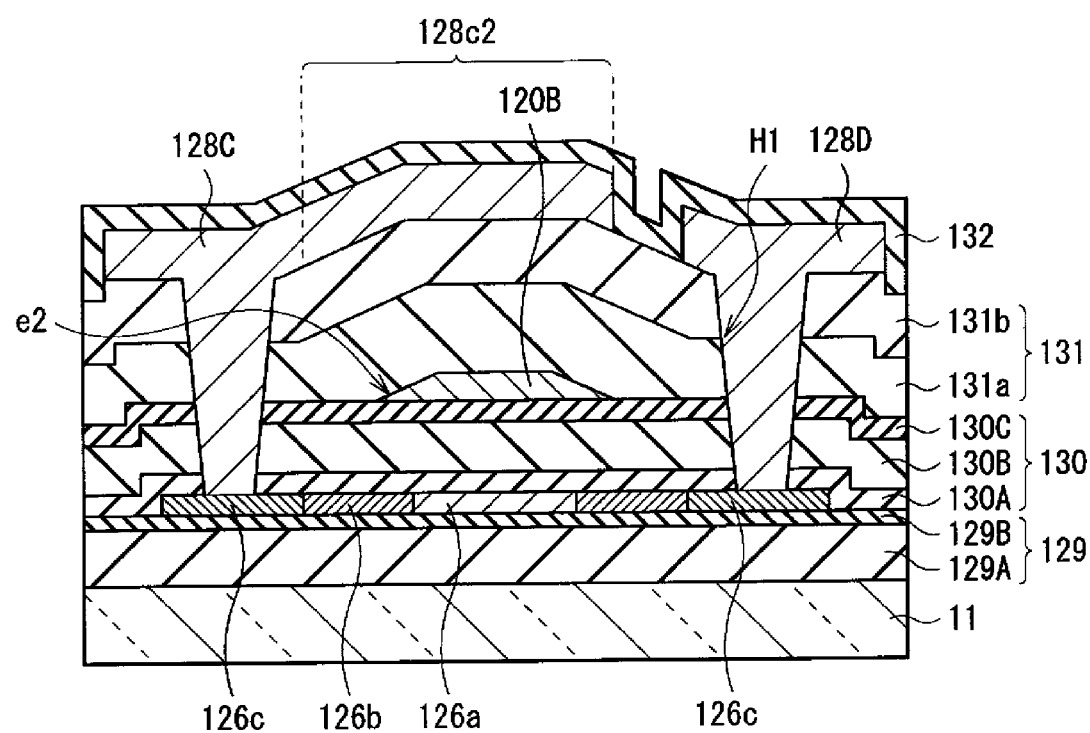

RADIOACTIVE-RAY IMAGING APPARATUS, RADIOACTIVE-RAY IMAGING DISPLAY SYSTEM AND TRANSISTOR

CROSS-REFERENCE TO RELATED APPLICATIONS

The present application is a divisional of U.S. patent application Ser. No. 13/485,485, filed May 31, 2012, which claims priority from JP 2011-127598, filed Jun. 7, 2011, and JP 2012-000956, filed Jan. 6, 2012, the entire contents of which are hereby incorporated herein by reference.

BACKGROUND

The present disclosure relates to a radioactive-ray imaging apparatus proper for X-ray imaging operations for typically medical cares and nondestructive inspections and relates to a radioactive-ray imaging display system employing such an apparatus as well as transistors employed in the apparatus and the system.

In recent years, a technique making use of a CCD (Charge Coupled Device) image sensor and/or a CMOS (Complementary Metal Oxide Semiconductor) image sensor is the mainstream of imaging techniques based on photoelectric conversion. The imaging technique based on photoelectric conversion is a technique for acquiring an image as an electrical signal. The imaging area of the imaging sensor is limited by the size of a crystal substrate or a silicon wafer. In the field of the medical care carried out by making use of an X ray in particular, however, there are demands for an imaging area having a large size, and the number of demands for a good moving-picture performance is also increasing.

A radioactive-ray imaging apparatus for obtaining an image based on radioactive rays as an electrical signal without making use of a radioactive-ray photographic film is being developed as an imaging apparatus required to have an imaging area with a large size. A typical example of the imaging apparatus required to have an imaging area with a large size is the X-ray imaging apparatus for taking an image of the chest of a human body. Such a radioactive-ray imaging apparatus is an apparatus having a wavelength conversion layer (serving as a fluorescent material) on a circuit substrate including photoelectric conversion devices such as photodiodes and TFTs (thin-film transistors). In the radioactive-ray imaging apparatus, after an incident radioactive ray has been converted into a visible ray, the visible ray is received by the photoelectric conversion device for converting the visible ray into an electrical signal. Then, a circuit employing the TFT reads out the electrical signal, the magnitude of which is determined by the quantity of the visible ray.

In this case, the transistor is created as follows. A plurality of layers are created on a substrate to form a laminated stack having the so-called top-gate structure or the so-called bottom-gate structure. The layers include an electrode layer for the gate, source and drain electrodes of the transistor and the like, a semiconductor layer used for creating the channel of the transistor, a gate insulation film and an interlayer insulation film. However, if a silicon-oxide film is used as the gate insulation film in the transistor having such a structure for example, an X ray may propagate to the inside of the film. If an X ray propagates to the inside of the silicon-oxide film, holes are generated in the film so that a threshold voltage Vth of the transistor is shifted to the negative side as is generally known. (Refer to documents such as Japanese Patent Laid-open No. 2008-252074.)

On the other hand, there has been proposed a transistor allowing the length of the shift of the threshold voltage Vth to be reduced by adoption of a dual-gate structure in which two gate electrodes are provided to sandwich a semiconductor layer. (Refer to Japanese Patent Laid-open No. 2004-265935.)

SUMMARY

Also in the case of the transistor adopting the dual-gate structure, however, the threshold voltage Vth is shifted in no small measure due to the effect of the holes generated in the silicon-oxide film by radiation of radioactive rays. It is thus desirable to repress such characteristic deteriorations attributed to radioactive rays in order to implement a transistor capable of demonstrating higher reliability.

It is thus an aim of the present disclosure addressing the problems described above to provide a transistor capable of repressing characteristic deteriorations attributed to radioactive rays in order to improve reliability, a radioactive-ray imaging apparatus employing the transistor and a radioactive-ray imaging display system including the apparatus.

A transistor according to the embodiment of the present disclosure includes:

a semiconductor layer;

a first gate insulation film and a first interlayer insulation film which are provided on a specific surface side of the semiconductor layer;

a first gate electrode provided at a location between the first gate insulation film and the first interlayer insulation film;

an insulation film provided on the other surface side of the semiconductor layer;

source and drain electrodes provided by being electrically connected to the semiconductor layer; and a shield electrode layer provided in such a way that at least portions of the shield electrode layer face edges of the first gate electrode.

In the transistor, at least one of the first gate insulation film, the first interlayer insulation film and the insulation film include a silicon-oxide film.

A radioactive-ray imaging apparatus according to the embodiments of the present disclosure has a pixel section including the transistor according to the embodiments of the present disclosure and a photoelectric conversion device.

As described above, in the transistor and the radioactive-ray imaging apparatus according to the embodiments of the present disclosure, the silicon-oxide film, which is included in at least one of the first gate insulation film, the first interlayer insulation film, and the insulation film, is electrically charged with positive electrical charge of holes generated by radiation of radioactive rays to the silicon-oxide film and the positive electric charge shifts the threshold voltage Vth of the transistor. By providing the shield electrode layer in such a way that at least portions of the shield electrode layer face the edges of the first gate electrode, however, it is possible to reduce the effect of the positive electric charge particularly in the vicinity of a channel edge of the semiconductor layer and, thus, repress the shift of the threshold voltage Vth.

A radioactive-ray imaging display system according to the embodiments of the present disclosure includes an imaging apparatus (that is, the radioactive-ray imaging apparatus according to the embodiments of the present disclosure) for acquiring an image based on radioactive rays and a display apparatus for displaying the image acquired by the imaging apparatus.

In the transistor and the radioactive-ray imaging apparatus which are provided by the embodiment of the present disclosure, at least one of the first gate insulation film and the first interlayer insulation film which are provided on the specific surface side of the semiconductor layer and the insulation film provided on the other surface side of the semiconductor layer include a silicon-oxide film. The shield electrode layer provided in such a way that at least portions of the shield electrode layer face the edges of the first gate electrode. Thus, it is possible to repress a threshold-voltage shift caused by radiation of radioactive rays. As a result, it is possible to repress characteristic deteriorations attributed to the radiation of radioactive rays and, therefore, improve the reliability.

BRIEF DESCRIPTION OF THE DRAWINGS

FIGS. 24A and 24B are cross-sectional diagrams showing another rough configuration of the transistor shown in FIG. 23;

DETAILED DESCRIPTION OF THE PREFERRED EMBODIMENTS

Embodiments of the present disclosure are explained below by referring to diagrams. It is to be noted that the explanation is divided into topics arranged in the following order.

Figure 1:
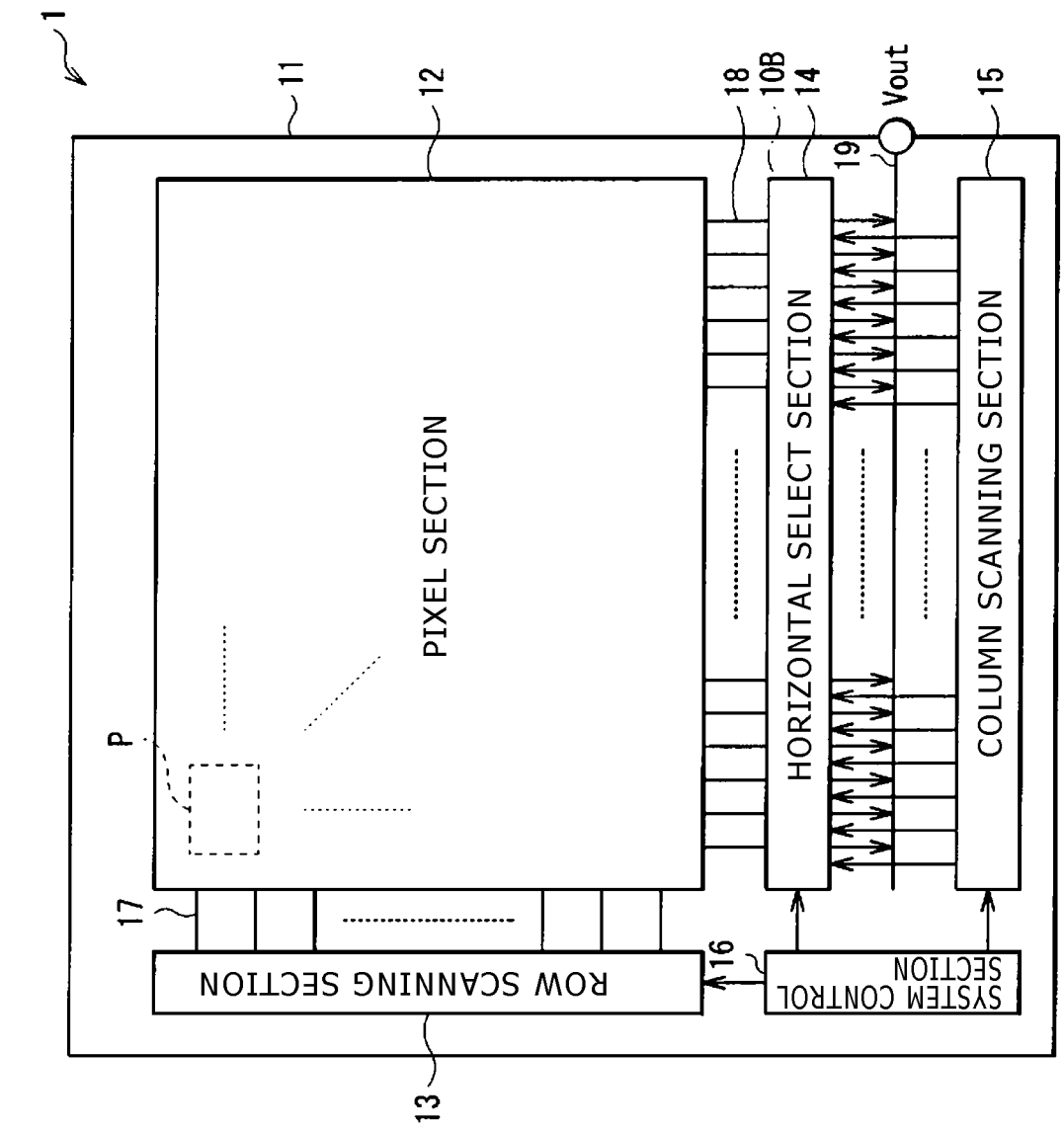
FIG. 1 is a functional block diagram showing the whole configuration of a radioactive-ray imaging apparatus according to a first embodiment of the present disclosure.

1: First Embodiment (A radioactive-ray imaging apparatus designed into an indirect conversion type to employ a transistor in which portions of both the source and drain electrodes forming a pair are each used as a shield electrode layer)
2: First Modification (A typical configuration in which a portion of the drain electrode is used as a shield electrode layer)
3: Second Embodiment (A typical configuration in which a shield electrode layer is provided separately from a pair of source and drain electrodes)
4: Second Modification (A typical configuration in which a shield electrode layer is held at a negative electric potential)
5: Third Modification (A typical transistor having a double-gate structure)
6: Fourth Modification (Another typical transistor having a double-gate structure)
7: Fifth Modification (A further typical transistor having a double-gate structure)
8: Sixth Modification (A typical transistor having a top-gate structure)
9: Seventh Modification (A typical transistor having a bottom-gate structure)
10: Eighth Modification (A typical pixel circuit adopting the passive driving method)
11: Ninth Modification (A typical radioactive-ray imaging apparatus of the direct conversion type)
12: Typical Application (A typical radioactive-ray imaging display system)
1: First Embodiment
Whole Configuration of Radioactive-Ray Imaging Apparatus FIG. 1 is a functional block diagram showing the whole configuration of a radioactive-ray imaging apparatus 1 according to a first embodiment of the present disclosure. The radioactive-ray imaging apparatus 1 is the so-called indirect-conversion-type FPD (Flat Panel Detector) which receives radioactive rays after the rays have been subjected to a wavelength conversion process and obtains image information based on the radioactive rays as an electrical signal. In this case, typical radioactive rays are the α, β, γ and X rays. For example, the radioactive-ray imaging apparatus 1 is an X-ray imaging apparatus which is proper for mainly medical cares and other nondestructive inspections such as baggage inspections.

As shown in the figure, the radioactive-ray imaging apparatus 1 employs a pixel section 12 created on a substrate 11 and peripheral circuits (also referred to as driving circuits) provided in areas surrounding the pixel section 12. The peripheral circuits typically include a row scanning section 13, a horizontal select section 14, a column scanning section 15 and a system control section 16.

The pixel section 12 is the imaging area of the radioactive-ray imaging apparatus 1. The pixel section 12 includes unit pixels P (each also referred to hereafter merely as a pixel P) which are laid out 2-dimesionally to form typically a pixel matrix. The unit pixel P may also be referred to hereafter merely as a pixel P in some cases. The unit pixels P are connected to pixel driving lines 17. Typically, two pixel driving lines 17 are connected to the unit pixels P on each pixel row in the pixel matrix. To put it concretely, the two pixel driving lines 17 connected to the unit pixels P on each pixel row are a row select line and a reset control line. Every pixel P includes a photoelectric conversion device for generating electric charge having an amount according to the quantity of light incident to the pixel P and storing the electric charge internally in the pixel P. In the following description, the quantity of light incident to the pixel P is also referred to as a received-light quantity whereas the electrical charge is also referred to as an optical electric charge. By the way, a photodiode 111A to be explained later is used as the photoelectric conversion device cited above.

In the pixel section 12, the two pixel driving lines 17 provided for every pixel row are stretched in the row direction. In addition, for every pixel column, the unit pixels P in the pixel section 12 are also connected to a vertical signal line 18 stretched in the column direction. The pixel driving line 17 conveys a driving signal for reading out a signal from a pixel P connected to the pixel driving line 17. In FIG. 1, a pixel driving line 17 is shown as a line even though the pixel driving line 17 is by no means limited to one line. One end of the pixel driving line 17 is connected to an output terminal of the row scanning section 13. This output terminal connected to a pixel driving line 17 is a terminal specially provided for a row along which the pixel driving line 17 is stretched. The configuration of the pixel section 12 will be described later.

Figure 2:
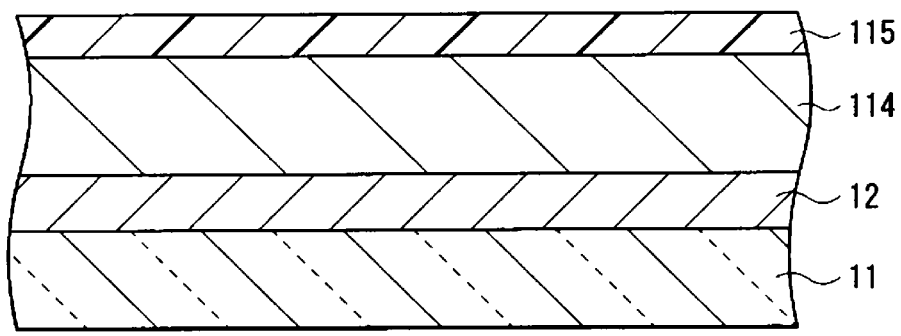
FIG. 2 is a model diagram showing a cross-sectional structure of a pixel section shown in FIG. 1 (as a section having an indirect conversion type)

As show in FIG. 2, a scintillator layer 114 (serving as a wavelength conversion layer) is created on the pixel section 12 and is covered by a protection layer 115.

The scintillator layer 114 carries out a wavelength conversion process to change the wavelength of an incident radioactive ray to a value in a sensitive region of the photodiode 111A to be described later. The scintillator layer 114 makes use of a fluorescent material for typically converting an X ray into a visible ray. Typical examples of the fluorescent material are cesium iodide (CsI) doped with thallium (Tl), sulfur-cadmium oxide ($Gd_2O_2S$) doped with terbium (Tb) and BaFx (where X can be Cl, Br, I or the like). A desirable thickness of the scintillator layer 114 is in a range of 100 microns to 600 microns. For example, the thickness of the scintillator layer 114 can be set at 600 microns. Such a scintillator layer 114 can be created on a flattening film 113 typically by adoption of a vacuum evaporation method.

The protection layer 115 is typically an organic film made of parylene C or the like. The fluorescent material (such as particularly CsI) used for making the scintillator layer 114 is prone to deterioration caused by moistures. It is thus desirable to provide the protection layer 115 serving as a moisture barrier layer on the scintillator layer 114.

The row scanning section 13 is configured to include a shift register and an address decoder. The row scanning section 13 functions as a pixel driving section for driving the unit pixels P in the pixel section 12 in typically row units. Signals output by pixels P on a pixel row selected by the row scanning section 13 in a scanning operation are supplied to the horizontal select section 14 through the vertical signal lines 18 connected to the pixels P. The horizontal select section 14 is configured to include amplifiers each provided for one of the vertical signal lines 18 and horizontal select switches also each provided for one of the vertical signal lines 18.

The column scanning section 15 is configured to include a shift register and an address decoder. The column scanning section 15 scans the horizontal select switches of the horizontal select section 14 in order to sequentially select the switches on a one-switch-after-another basis. The column scanning section 15 scans and selects the horizontal select switches in order to supply the signals asserted by pixels P on the vertical signal lines 18 on a one-signal-after another basis on a horizontal select line 19 connected to sections external to the substrate 11.

Circuit portions serving as the row scanning section 13, the horizontal select section 14, the column scanning section 15 and the horizontal select line 19 may be created directly above the substrate 11 or provided in an external control IC. As an alternative, these circuit portions can also be created on another substrate which is connected to the substrate 11 by a cable or the like.

The system control section 16 receives, among others, a clock signal from a source external to the substrate 11 and data specifying an operating mode. In addition, the system control section 16 outputs data such as internal information of the radioactive-ray imaging apparatus 1. On top of that, the system control section 16 also has a timing generator for generating a variety of timing signals and carries out control to drive the peripheral circuits such as the row scanning section 13, the horizontal select section 14 and the column scanning section 15 on the basis of the timing signals generated by the timing generator.

Detailed Configuration of the Pixel Section 12

Figure 3:
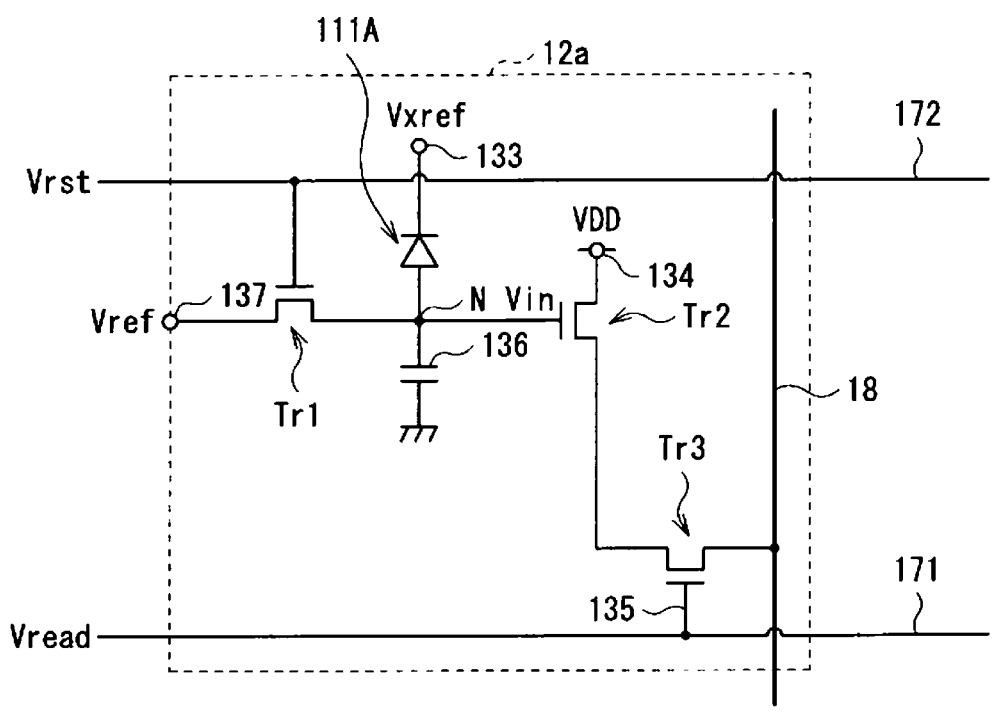
FIG. 3 is a diagram showing a typical pixel circuit employed in the pixel section shown in FIG. 2 (to serve as an active-driven circuit)

The pixel section 12 includes pixel circuits 12a created on the substrate 11. The pixel circuit 12a is shown in FIG. 3. Each of the pixel circuits 12a employs a photodiode 111A and transistors 111B. The photodiode 111A and the transistors 111B will be described later. It is to be noted that an organic insulation film serving as a flattening film not shown in the figure is typically provided on the pixel circuit 12a. In addition, a protection film also not shown in the figure may also be provided on the flattening film. Detailed configurations of components composing the pixel section 12 are explained as follows.

Pixel Circuit

FIG. 3 is a diagram showing a typical pixel circuit 12a in a photoelectric conversion layer 112. As shown in the figure, the pixel circuit 12a employs a photodiode 111A serving as the photoelectric conversion device mentioned before as well as transistors Tr1, Tr2 and Tr3 which are the transistors 111B cited above. The pixel circuit 12a is connected to the vertical signal line 18 described before, a row select line 171 and a reset control line 172 which function as the pixel driving lines 17.

The photodiode 111A is typically a PIN (Positive Intrinsic Negative) diode. Typically, the sensitive region of the photodiode 111A is a visible-light region. That is to say, the received-light wavelength region of the photodiode 111A is a visible-light region. When a reference electric potential Vxref is applied to a terminal 133 connected to a specific end of the photodiode 111A, the photodiode 111A generates signal electric charge having an amount corresponding to the quantity of light incident to the photodiode 111A. The other end of the photodiode 111A is connected to an accumulation node N. The accumulation node N has a capacitor 136 for accumulating the signal electric charge generated by the photodiode 111A. Note that it is also possible to provide a configuration in which the photodiode 111A is connected between the accumulation node N and the ground. A cross-sectional structure of the photodiode 111A will be described later.

Each of the transistors Tr1, Tr2 and Tr3 is typically a FET (Field Effect Transistor) of N-type or P-type in which a semiconductor layer for channel creation is made typically from LTPS (Low-Temperature Polysilicon). This semiconductor layer is a semiconductor layer 126 to be described later. However, the material used for making the semiconductor layer does not have to be the LTPS. For example, the semiconductor layer can also be made of a silicon-group semiconductor such as microcrystal silicon or polysilicon. As an alternative, the semiconductor layer can also be made of a semiconductor oxide such as indium-gallium-zinc oxide (InGaZnO) or zinc oxide (ZnO).

The transistor Tr1 is a reset transistor connected between a terminal 137 for receiving a reference electric potential Vref and the accumulation node N. When the reset transistor Tr1 is turned on in response to a reset signal Vrst, the reset transistor Tr1 resets the electric potential appearing at the accumulation node N to the reference electric potential Vref.

The transistor Tr2 is a read transistor. The gate electrode of the read transistor Tr2 is connected to the accumulation node N whereas the drain electrode of the read transistor Tr2 is connected to a terminal 134 which is connected to a power supply VDD. The gate electrode of the read transistor Tr2 receives a signal representing signal electric charge accumulated in the photodiode 111A whereas the source electrode of the read transistor Tr2 outputs a signal voltage according to the signal electric charge.

The transistor Tr3 is a row select transistor connected between the source electrode of the read transistor Tr2 and the vertical signal line 18. When the row select transistor Tr3 is turned on in response to a row scanning signal Vread, the row select transistor Tr3 passes on the signal appearing at the source electrode of the read transistor Tr2 to the vertical signal line 18. With regard to the row select transistor Tr3, it is also possible to provide a configuration in which the row select transistor Tr3 is connected between the drain electrode of the read transistor Tr2 and the power supply VDD whereas the source electrode of the read transistor Tr2 is connected directly to the vertical signal line 18.

The following description explains cross-sectional structures of each of the transistors Tr1, Tr2 and Tr3 which are each also referred to as the transistor 111B which is a generic technical term for the transistors Tr1, Tr2 and Tr3.

Detailed Configuration of the Transistor 111B

Figure 4:
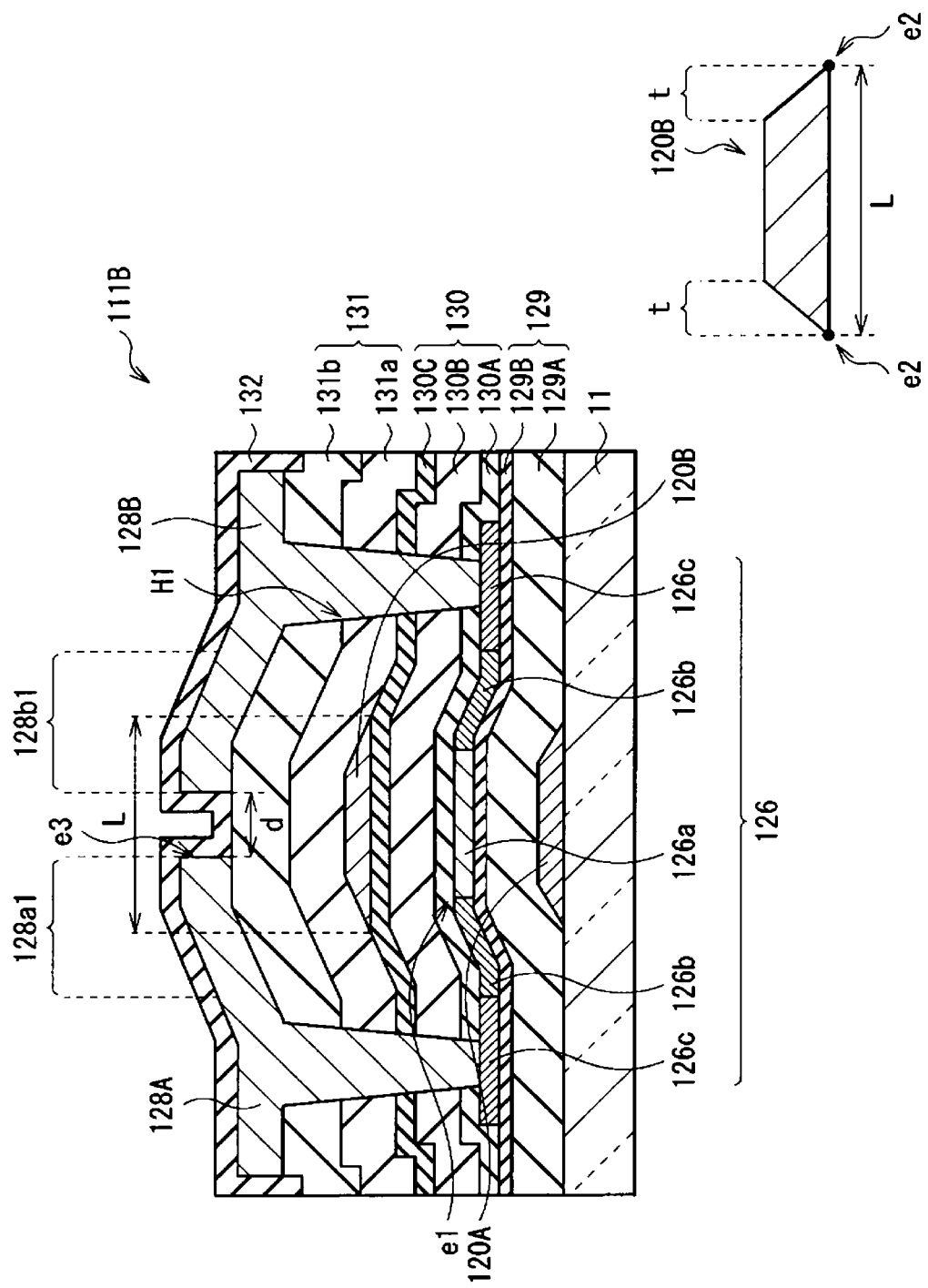
FIG. 4 is a cross-sectional diagram showing a rough configuration of a transistor shown in FIG. 3.

FIG. 4 is a cross-sectional diagram showing a typical configuration of the transistor 111B. The transistor 111B has the so-called dual-gate structure in which the two gate electrodes of the transistor 111B sandwich a semiconductor layer 126. To put it concretely, the transistor 111B has a gate electrode 120A in a selective area on a substrate 11 whereas a second gate insulation film 129 is provided to cover the gate electrode 120A. On the second gate insulation film 129, the semiconductor layer 126 is provided. The semiconductor layer 126 includes a channel layer 126a. The semiconductor layer 126 also includes an LDD (Lightly Doped Drain) layer 126b and an $N^+$ layer 126c on each of the two edges of the channel layer 126a. A first gate insulation film 130 is provided to cover the semiconductor layer 126. In a selective area on the first gate insulation film 130, a gate electrode 120B is provided. The selective area on the first gate insulation film 130 is an area facing the gate electrode 120A.

On the gate electrode 120B, a first interlayer insulation film 131 is created. Holes H1 are provided in portions of the first interlayer insulation film 131 and the first gate insulation film 130. On the first interlayer insulation film 131, a pair of source and drain electrodes 128A and 128B are provided on the first interlayer insulation film 131 to fill up such holes H1 so that the source and drain electrodes 128A and 128B are electrically connected to the semiconductor layer 126. A second interlayer insulation film 132 is provided on the source and drain electrodes 128A and 128B.

It is to be noted that the gate electrode 120B according to this embodiment is a concrete example of the first gate electrode according to the embodiment of the present disclosure whereas the gate electrode 120A according to this embodiment is a concrete example of the second gate electrode according to the embodiment of the present disclosure. In addition, the first gate insulation film 130 according to this embodiment is a concrete example of the first gate insulation film according to the embodiment of the present disclosure whereas the second gate insulation film 129 according to this embodiment is a concrete example of the insulation film according to the embodiment of the present disclosure. On top of that, the first interlayer insulation film 131 according to this embodiment is a concrete example of the first interlayer insulation film according to the embodiment of the present disclosure whereas the second interlayer insulation film 132 according to this embodiment is a concrete example of the second interlayer insulation film according to the embodiment of the present disclosure.

Each of the gate electrode 120A and the gate electrode 120B is a single-layer film or a multi-layer film and the film is made of a material such as titan (Ti), aluminum (Al), molybdenum (Mo), tungsten (W) or chrome (Cr). As described above, the second gate insulation film 129 is sandwiched between the gate electrode 120A and the semiconductor layer 126 whereas the first gate insulation film 130 is sandwiched between the semiconductor layer 126 and the gate electrode 120B which faces the gate electrode 120A. In other words, the gate electrode 120A and the gate electrode 120B face each other in about the same area, sandwiching the channel layer 126a. Such a gate electrode 120B is subjected to a patterning process by making use of typically the same photo mask as the gate electrode 120A. However, it is desirable to provide an ideal configuration in which the gate electrode 120B is provided right above the gate electrode 120A.

The thickness of each of the gate electrode 120A and the gate electrode 120B is in a range of 30 nm to 150 nm. For example, the thickness of the gate electrode 120A is set at a typical value of 65 nm whereas the thickness of the gate electrode 120B is set at a typical value of 90 nm.

Each of the second gate insulation film 129 and the first gate insulation film 130 is configured to include typically a silicon-oxide film. As the silicon-oxide film, it is possible to make use of a silicon compound film including oxygen. A typical example of the silicon compound film is a film made of silicon oxide ($SiO_2$) or silicon oxynitride (SiON). To put it concretely, each of the second gate insulation film 129 and the first gate insulation film 130 is a laminated film created as a stack from a film made of silicon oxide ($SiO_2$) and a film made of silicon nitride ($SiN_x$). To be more specific, the second gate insulation film 129 is a laminated stack created by sequentially superposing a silicon-nitride film 129A and a silicon-oxide film 129B on the substrate 11 in the same order as the order in which the silicon-nitride film 129A and the silicon-oxide film 129B are enumerated in this sentence. By the same token, the first gate insulation film 130 is a laminated stack created by sequentially superposing a silicon-oxide film 130A, a silicon-nitride film 130B and a silicon-oxide film 130C on the semiconductor layer 126 in the same order as the order in which the silicon-oxide film 130A, the silicon-nitride film 130B and the silicon-oxide film 130C are enumerated in this sentence. That is to say, it is desirable to provide a configuration in which the silicon-oxide film 129B and the silicon-oxide film 130A are created in the vicinity of the semiconductor layer 126 and at locations sandwiching the semiconductor layer 126. Such a configuration is provided in order to eliminate a threshold-voltage shift caused by the effect of a boundary-surface level on the semiconductor layer 126.

The semiconductor layer 126 can be made of typically polysilicon, low-temperature polysilicon, microcrystal silicon or a non-crystal silicon. However, it is desirable to make the semiconductor layer 126 of low-temperature polysilicon. As an alternative, the semiconductor layer 126 can also be made of a semiconductor oxide such as indium-gallium-zinc oxide (IGZO). On each edge side of the channel layer 126a in the semiconductor layer 126, the $N^+$ layer 126c is provided to serve as an area of connection with the source or drain electrode 128A or 128B. The edge sides of the channel layer 126a are edges on the source and drain sides. In addition, the LDD layer 126b is created between the channel layer 126a and the $N^+$ layer 126c for the purpose of reducing the magnitude of a leak current.

Source/Drain Electrodes and Shield Electrode Layer

Each of the source and drain electrodes 128A and 128B is capable of functioning as a source or drain electrode, making it possible to swap the functions of the source and drain electrodes with each other between the source and drain electrodes 128A and 128B. In addition, while any one of the source and drain electrodes 128A and 128B is functioning as a source electrode, the other of the source and drain electrodes 128A and 128B is functioning as a drain electrode. Each of the source and drain electrodes 128A and 128B is a single-layer film or a multi-layer film and the film is made of a material such as titan (Ti), aluminum (Al), molybdenum (Mo), tungsten (W) or chrome (Cr). The source and drain electrodes 128A and 128B are connected to wires for reading out signals. In order to make each of the source and drain electrodes 128A and 128B capable of functioning as a source or drain electrode and make it possible to swap the functions of the source and drain electrodes with each other between the source and drain electrodes 128A and 128B in this embodiment as described above, the transistor 111B is designed into a configuration in which the LDD layer 126b is provided on each of the two sides of the channel layer 126a.

In this embodiment, each of the source and drain electrodes 128A and 128B is provided by being extended to an area facing an edge e2 of the gate electrode 120B. In other words, each of the source and drain electrodes 128A and 128B is provided to overlap (or, strictly speaking, partially overlap) an area facing the edge e2 of the gate electrode 120B. The portions facing the edges e2 correspond to the shield electrode layers 128a1 and 128b1 respectively. That is to say, the portions facing the edges e2 function also as the shield electrode layers 128a1 and 128b1 respectively. As described above, the gate electrode 120B is provided to face the gate electrode 120A. Since the channel layer 126a is created in an area corresponding to the gate electrode 120A in the semiconductor layer 126, however, the source and drain electrodes 128A and 128B are provided to face channels edges e1. It is to be noted that, as described above, the LDD layer 126b is provided on each of the two sides of the channel layer 126a and, in this case, the shield electrode layers 128a1 and 128b1 are superposed also on the LDD layer 126b.

It is to be noted that, in this embodiment, the gate electrode 120B has a taper portion on each of the side surfaces thereof. These taper portions are created inevitably in an etching process. If the gate electrode 120B has such taper portions, the edges e2 of the gate electrode 120B are the bottom edges of the taper portions as shown in an enlarged diagram provided on the right bottom corner of FIG. 4.

The shield electrode layers 128a1 and 128b1 function as electrical shields for reducing the effect of positive electric charge accumulated in the silicon-oxide film on the semiconductor layer 126 (or, particularly the channel layer 126a). At least, portions of the shield electrode layers 128a1 and 128b1 are provided to face the edges e2 of the gate electrode 120B. It is desirable to provide the shield electrode layers 128a1 and 128b1 in such a way that the distance d between the shield electrode layers 128a1 and 128b1 is smaller than the gate length L of the gate electrode 120B. It is even more desirable to provide the shield electrode layers 128a1 and 128b1 in such a way that the shield electrode layers 128a1 and 128b1 cover all the taper portions of the gate electrode 120B. In this case, as explained before, it is ideal to provide the gate electrode 120B at the same position as the gate electrode 120A. In actuality, however, the position of the gate electrode 120B may be shifted from the position of the gate electrode 120A in some cases. The shift of the position of the gate electrode 120B from the position of the gate electrode 120A is referred to as an adjustment shift. If the shield electrode layers 128a1 and 128b1 cover the taper portions of the gate electrode 120B, the effect of holes serving as positive electric charge on the channel layer 126a can be reduced even in the case of such an adjustment shift. It is to be noted that the lower limit of the distance d between the shield electrode layers 128a1 and 128b1 is not limited to any value in particular. If the shield electrode layers 128a1 and 128b1 are too close to each other, however, problems such as a short circuit are raised. It is thus nice to set the position of an edge e3 by taking these problems into consideration. In this embodiment, the shield electrode layers 128a1 and 128b1 are provided on the first interlayer insulation film 131 as portions of the source and drain electrodes 128A and 128B as described above.

In the same way as the second gate insulation film 129 and the first gate insulation film 130, each of the first interlayer insulation film 131 and the second interlayer insulation film 132 is configured as a single-layer film or a multi-layer film and the film is typically a silicon-oxide film, a silicon-oxynitride film or a silicon-nitride film. In this case, the first interlayer insulation film 131 is a laminated stack including the silicon-oxide film 131a and the silicon-nitride film 131b which are sequentially created above the substrate 11 in the same order as the order in which the silicon-oxide film 131a and the silicon-nitride film 131b are enumerated in this sentence. On the other hand, the second interlayer insulation film 132 is a silicon-oxide film. It is to be noted that the layer of a portion of the transistor 111B is common to the photodiode 111A to be described later. That is to say, the layer of the portion of the transistor 111B is created in the same thin-film process as the photodiode 111A. Thus, as long as the second interlayer insulation film 132 in the photodiode 111A is concerned, from the viewpoint of an etching select ratio used at the fabrication time, it is desirable to make use of a silicon-oxide film rather than a silicon-nitride film as the second interlayer insulation film 132.

Method for Manufacturing the Transistor 111B

The transistor 111B described above can be manufactured typically as follows. FIGS. 5A to 5I are explanatory cross-sectional model diagrams to be referred to in the following description of a process sequence according to a method for manufacturing the transistor 111B.

Figure 5A:
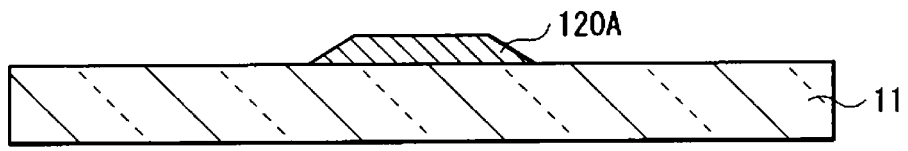
FIGS. 5A to 5C are explanatory cross-sectional model diagrams to be referred to in description of a process sequence according to a method for manufacturing the transistor shown in FIG. 4.

First of all, as shown in FIG. 5A, the gate electrode 120A is created on the substrate 11. To put it concretely, after a film made of a high-melting-point metal such as Mo has been created on the substrate 11 by adoption of typically a sputtering method, the film is subjected to a patterning process adopting typically a photolithography method to form an island shape.

Figure 5B:
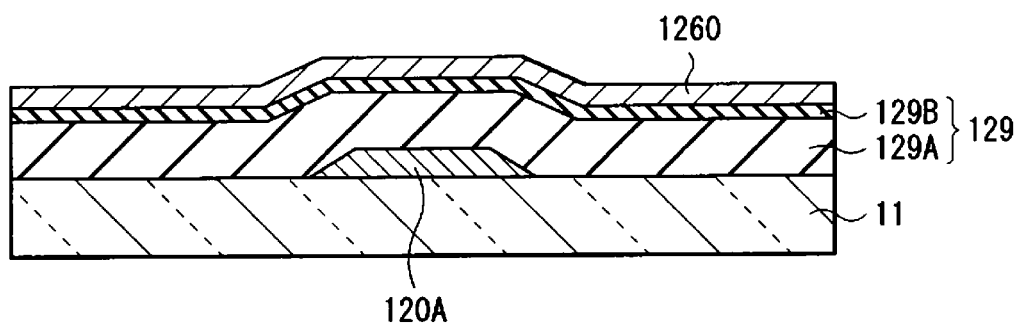

Then, as shown in FIG. 5B, the second gate insulation film 129 is created. To put it concretely, the silicon-nitride film 129A and the silicon-oxide film 129B are created sequentially and continuously to cover the gate electrode 120A on the substrate 11 in the same order as the order in which the silicon-nitride film 129A and the silicon-oxide film 129B are enumerated in this sentence by adoption of typically the CVD method for creating the second gate insulation film 129 having a thickness determined in advance.

Subsequently, on the created second gate insulation film 129, an amorphous silicon layer (that is, an α-Si layer) 1260 to be used as the semiconductor layer 126 is created by adoption of typically the CVD method.

Figure 5C:
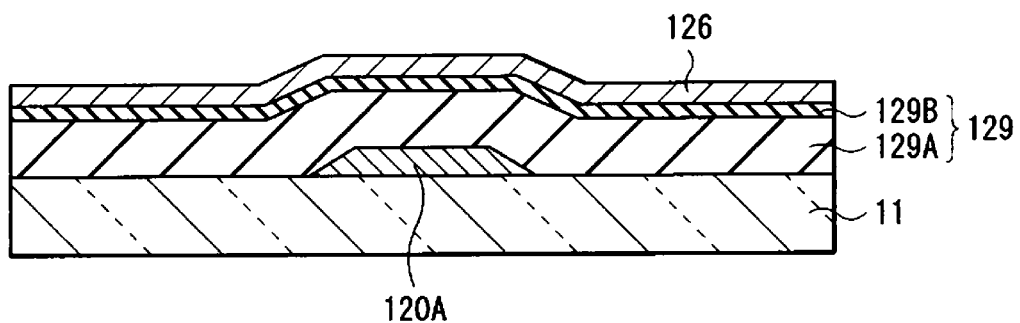

Then, as shown in FIG. 5C, the created α-Si layer 1260 is subjected to a multi-crystallization process in order to create the semiconductor layer 126. To put it concretely, first of all, at a typical temperature in a range of 400 degrees Celsius to 450 degrees Celsius, the α-Si layer 1260 is subjected to a dehydrogenation treatment (or an annealing process) in order to decrease the hydrogen content to a value not exceeding 1%. Then, by adoption of typically an ELA (Excimer Laser) method, a laser beam having a typical wavelength of 308 nm is radiated to the α-Si layer 1260 in order to convert the α-Si layer 1260 into a multi-crystal layer. Afterwards, the multi-crystal layer is doped with typically boron in order to adjust the threshold voltage Vth so as to create the semiconductor layer 126.

Figure 5D:
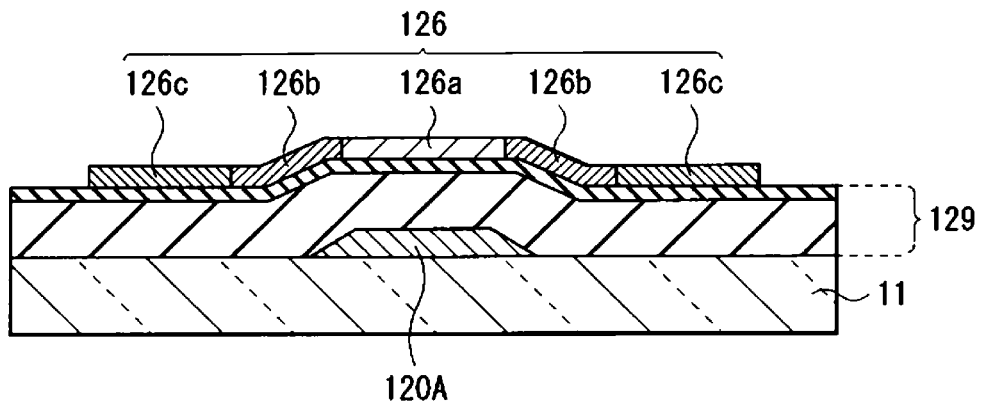
FIGS. 5D to 5F are explanatory cross-sectional model diagrams showing a process sequence serving as the continuation of the process sequence described by referring to FIG. 5C.

Subsequently, as shown in FIG. 5D, ions are injected into predetermined areas of the semiconductor layer 126 obtained as a result of the multi-crystallization process in order to create the LDD layer 126b and the $N^+$ layer 126c in each of the predetermined areas.

Figure 5E:
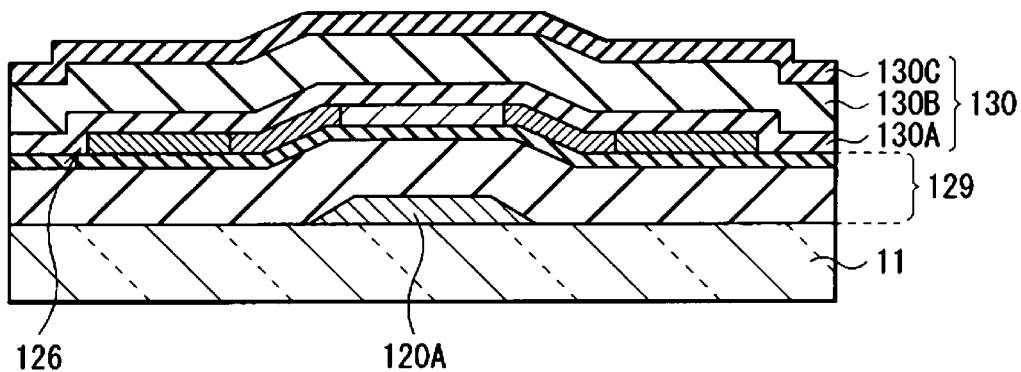

Then, as shown in FIG. 5E, the first gate insulation film 130 is created. To put it concretely, the silicon-oxide film 130A, the silicon-nitride film 130B and the silicon-oxide film 130C are continuously created as films each having a predetermined thickness in the same order as the order in which the silicon-oxide film 130A, the silicon-nitride film 130B and the silicon-oxide film 130C are enumerated in this sentence by adoption of typically the CVD method to form the first gate insulation film 130 covering the semiconductor layer 126. It is to be noted that the thicknesses of the silicon-oxide film 130A, the silicon-oxide film 130C and the silicon-oxide film 129B of the second gate insulation film 129 described above are set at such values that the sum of the thicknesses of the silicon-oxide film 130A, the silicon-oxide film 130C and the silicon-oxide film 129B of the second gate insulation film 129 is not greater than 65 nm. It is also worth noting that, after the first gate insulation film 130 has been created, contact holes are created in advance for electrically connecting the gate electrode 120A to the gate electrode 120B which is created in a process described below. However, the process of creating the contact holes is shown in none of the figures.

Figure 5F:
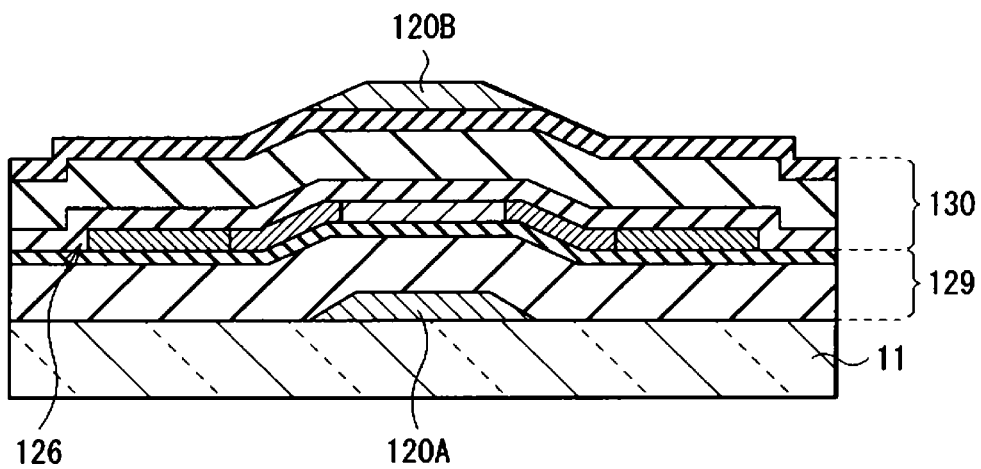

Then, as shown in FIG. 5F, the gate electrode 120B is created on the first gate insulation film 130. To put it concretely, after a film made of a high-melting-point metal such as Mo has been created on the substrate 11 by adoption of typically a sputtering method, the film is subjected to a patterning process adopting typically a photolithography method to form an island shape. At that time, the gate electrode 120B is subjected to a patterning process by making use of typically the same photo mask as the gate electrode 120A. However, it is desirable to adjust the position of the gate electrode 120B in order to create the gate electrode 120B ideally right above the gate electrode 120A.

Figure 5G:
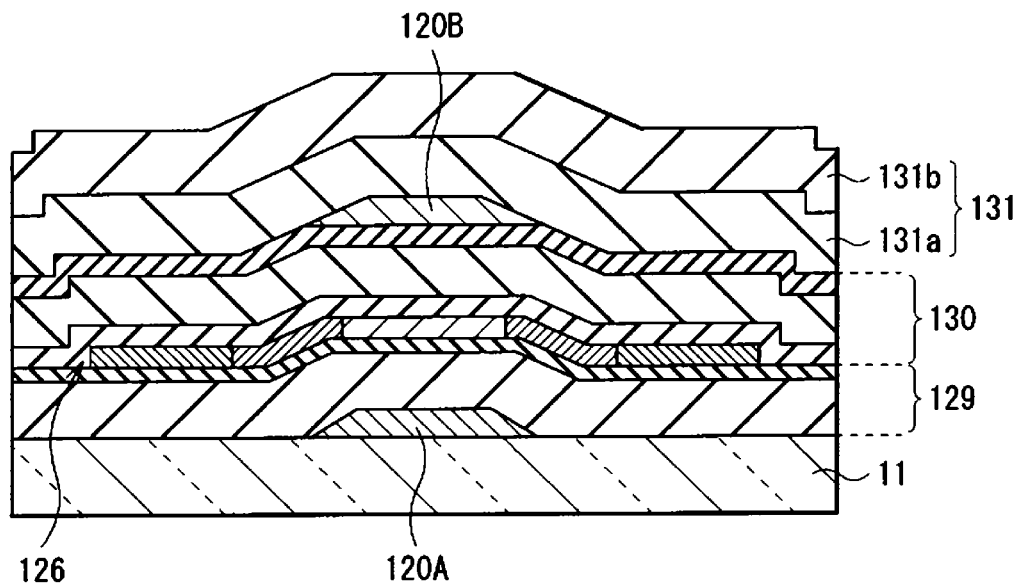
FIGS. 5G to 5H are explanatory cross-sectional model diagrams showing a process sequence serving as the continuation of the process sequence described by referring to FIG. 5F.

Then, as shown in FIG. 5G, the silicon-oxide film 131a and the silicon-nitride film 131b are continuously created by adoption of typically the sputtering method in the same order as the order in which the silicon-oxide film 131a and the silicon-nitride film 131b are enumerated in this sentence in order to create the first interlayer insulation film 131.

Figure 5H:
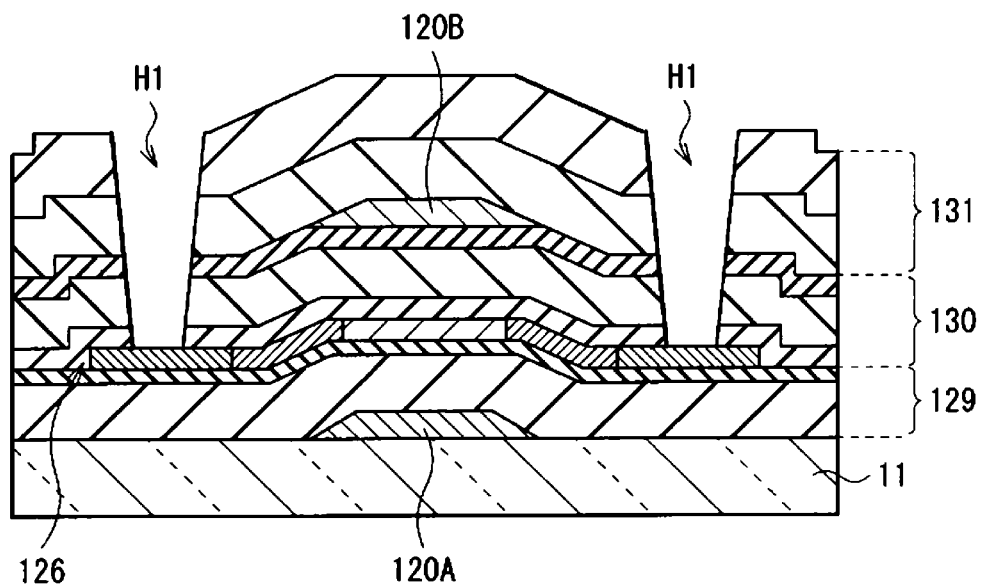

Subsequently, as shown in FIG. 5H, the contact holes H1 are created to penetrate the created first interlayer insulation film 131 and the created first gate insulation film 130 till the surface of the semiconductor layer 126 by carrying out typically an etching process.

Figure 5I:
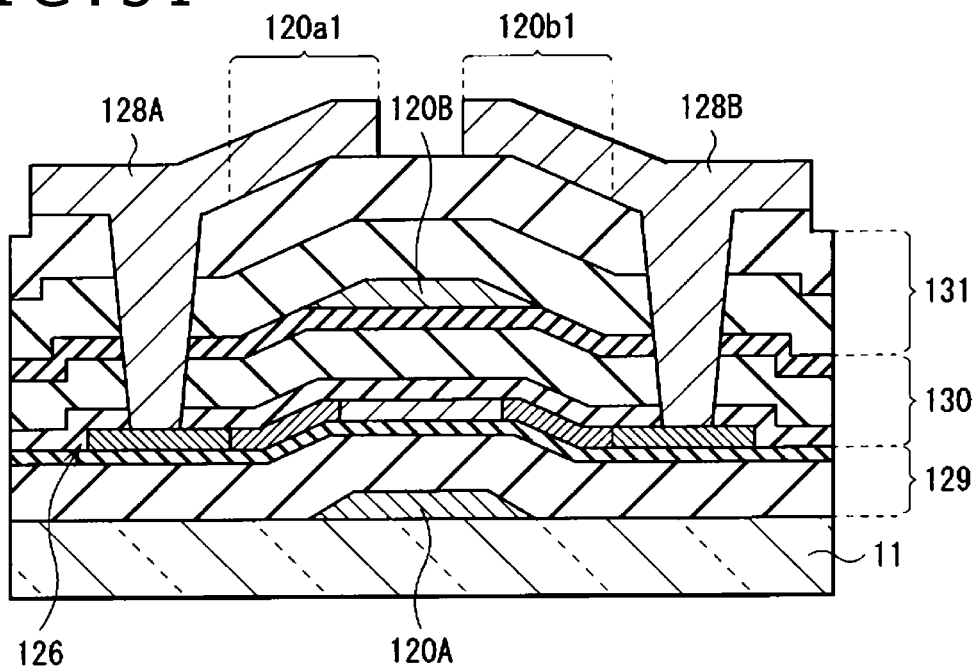
FIG. 5I is an explanatory cross-sectional model diagram to be referred to in description of a process serving as the continuation of the process sequence described by referring to FIG. 5H.

Afterwards, as shown in FIG. 5I, the source and drain electrodes 128A and 128B are created to fill up the holes H1 by adoption of typically the sputtering method and then subjected to a patterning process to form predetermined shapes of the source and drain electrodes 128A and 128B. In this process, a gap (or a separation groove) is created between the source and drain electrodes 128A and 128B so that a portion of each of the source and drain electrodes 128A and 128B overlaps the gate electrode 120B. Thus, the source and drain electrodes 128A and 128B are created to function also as the shield electrode layers 128a1 and 12bb1. Finally, a silicon-oxide layer or the like is created to serve as the second interlayer insulation film 132 on the source and drain electrodes 128A and 128B as well as the first interlayer insulation film 131 by adoption of typically the CVD method. The creation of the second interlayer insulation film 132 completes the transistor 111B shown in FIG. 4.

Configuration of the Photodiode 111A

Figure 6:
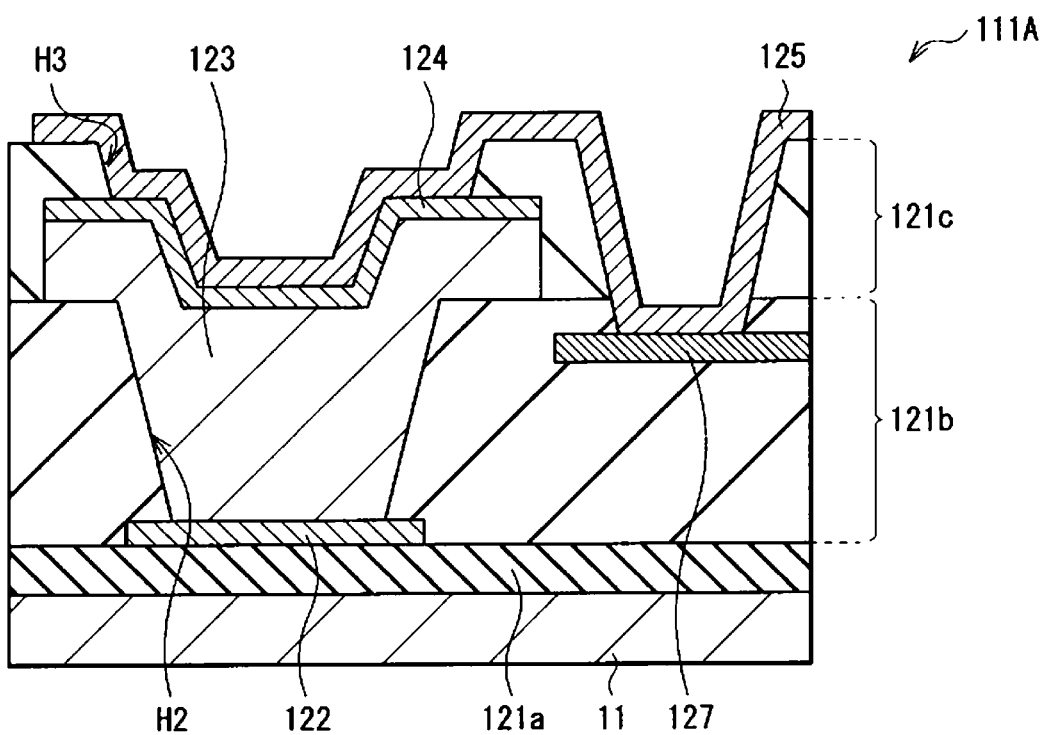
FIG. 6 is a model diagram showing a cross-sectional structure of a photodiode shown in FIG. 3.

FIG. 6 is a model diagram showing a typical cross-sectional configuration of the photodiode 111A. The photodiode 111A is provided on the substrate 11 along with the transistor 111B. A portion of the stack structure is common to the transistor 111B and is created by carrying out the same thin-film process as the transistor 111B. The detailed configuration of the photodiode 111A is explained as follows.

The photodiode 111A has a p-type semiconductor layer 122 in a selective area on a substrate 11. The p-type semiconductor layer 122 and the selective area sandwich a gate insulation layer 121a. A first interlayer insulation film 121b having a contact hole H2 is provided on the substrate 11 (or, strictly speaking, on the gate insulation layer 121a) to face the p-type semiconductor layer 122. An i-type semiconductor layer 123 is provided on the p-type semiconductor layer 122 and inside the contact hole H2 of the first interlayer insulation film 121b. On the i-type semiconductor layer 123, an n-type semiconductor layer 124 is created. In the n-type semiconductor layer 124, a second interlayer insulation film 121c having a contact hole H3 is provided. The n-type semiconductor layer 124 is electrically connected to an upper electrode 125 through the contact hole H3.

In the typical structure described above, on the side close to the substrate 11 or the lower side, the p-type semiconductor layer 122 is provided and, on the upper side, the n-type semiconductor layer 124 is provided. It is to be noted, however, that the structure can also be made upside down. That is to say, on the lower side, the n-type layer is provided and, on the upper side, the p-type layer is provided. In addition, a portion or the whole or each of the gate insulation layer 121a, the first interlayer insulation film 121b and the second interlayer insulation film 121c has the same layer structure as each layer of respectively the second gate insulation film 129, the first gate insulation film 130 and the first interlayer insulation film 131 which are employed in the transistor 111B. This photodiode 111A can be manufactured by carrying out the same thin-film process as the transistor 111B.

The p-type semiconductor layer 122 is a p+ area made of typically poly-crystal silicon (or polysilicon) doped with typically boron (B). The thickness of the p-type semiconductor layer 122 is typically in a range of 40 nm to 50 nm. The p-type semiconductor layer 122 functions also as typically a lower electrode for reading out signal electric charge. The p-type semiconductor layer 122 is connected to an accumulation node N described earlier by referring to FIG. 3. As an alternative, the p-type semiconductor layer 122 can also serve as the accumulation node N in which electric charge is accumulated.

The i-type semiconductor layer 123 is a semiconductor layer exhibiting intermediate conductivity between the p and n types. The i-type semiconductor layer 123 is typically an undoped pure semiconductor layer made of typically non-crystal silicon or amorphous silicon. The thickness of the i-type semiconductor layer 123 is typically in a range of 400 nm to 1,000 nm. The larger the thickness, the larger the optical sensitivity of the photodiode 111A.

The n-type semiconductor layer 124 is made of typically non-crystal silicon or amorphous silicon, forming an n+ area. The thickness of the n+ area is typically in a range of 10 nm to 50 nm.

The upper electrode 125 is an electrode for supplying a reference level provided for photoelectric conversion. The n-type semiconductor layer 124 is typically a transparent conductive film made of ITO (Indium Tin Oxide) or the like. The upper electrode 125 is connected to a power-supply wire 127 for applying a voltage to the upper electrode 125. The power-supply wire 127 is made of typically a material having a resistance lower than that of the upper electrode 125. Typical examples of the material are Ti, Al, Mo, W and Cr.

Effects of the Embodiment

Effects of this embodiment are explained by referring to FIGS. 1 to 4 and FIGS. 7 to 11 as follows. A radiation source shown in none of the figures radiates a radioactive ray such as an X ray to the radioactive-ray imaging apparatus 1. When the radioactive ray enters the radioactive-ray imaging apparatus 1 after passing through a detected body serving as the imaging object, the incident radioactive ray is subjected to a photoelectric conversion process following a wavelength conversion process in order to generate an electrical signal representing an image of the imaging object. To put it in detail, first of all, the radioactive ray incident to the radioactive-ray imaging apparatus 1 is subjected to the wavelength conversion process carried out by the scintillator layer 114 provided on the pixel section 12 in order to change the wavelength of the radioactive ray to a wavelength in the sensitive region (or the visible region in this case) of the photodiode 111A. Thus, the scintillator layer 114 emits visible light. The visible light emitted by the scintillator layer 114 in this way is supplied to the pixel section 12.

When an electric potential determined in advance is applied to the photodiode 111A from a power-supply line shown in none of the figures through the upper electrode 125, incident light is supplied to the pixel section 12 from the side close to the upper electrode 125 and the pixel section 12 carries out the photoelectric conversion process to convert the incident light into signal electric charge having an amount according to the quantity of the incident light. The signal electric charge generated as a result of the photoelectric conversion process is read out from the side close to the p-type semiconductor layer 122 as an optical current.

To put it in detail, electric charge generated as a result of the photoelectric conversion process carried out by the photodiode 111A is collected in the p-type semiconductor layer 122 (or the accumulation node N) serving as an accumulation layer and read out from the accumulation layer as a current which is supplied to the gate electrode of the transistor Tr2 functioning as a read transistor. Receiving the current read out from the accumulation layer, the read transistor Tr2 outputs a signal voltage according to the signal electric charge represented by the current. When the row select transistor Tr3 is turned on in response to the row scanning signal Vread, the signal voltage output by the read transistor Tr2 is asserted on the vertical signal line 18, that is the signal voltage output by the read transistor Tr2 is read out onto the vertical signal line 18. The signal voltage asserted on the vertical signal line 18 is output to the horizontal select section 14 through the vertical signal line 18 for each pixel column.

As described above, in this embodiment, an incident radioactive ray such as an X ray is subjected to a waveform conversion process and a photoelectric conversion process in order to obtain an electrical signal representing image information. However, some radioactive rays pass through the scintillator layer 114 as they are without experiencing the waveform conversion process carried out in the scintillator layer 114. If such radioactive rays hit the pixel section 12, in particular, a problem like one described as follows is raised in a transistor 111B. The transistor 111B has silicon-oxide films each containing oxygen in the second gate insulation film 129, the first gate insulation film 130, the first interlayer insulation film 131 and the second interlayer insulation film 132. If a radioactive ray hits an silicon-oxide film containing oxygen, electrons in the film are excited due to, among others, the so-called photoelectric effect, the Compton scattering phenomenon or the electron-pair generation phenomenon. As a result, residual holes are trapped on a boundary surface and a defect. That is to say, the boundary surface and the defect are electrically charged with residual holes.

Typical Comparison Transistor

Figure 7:
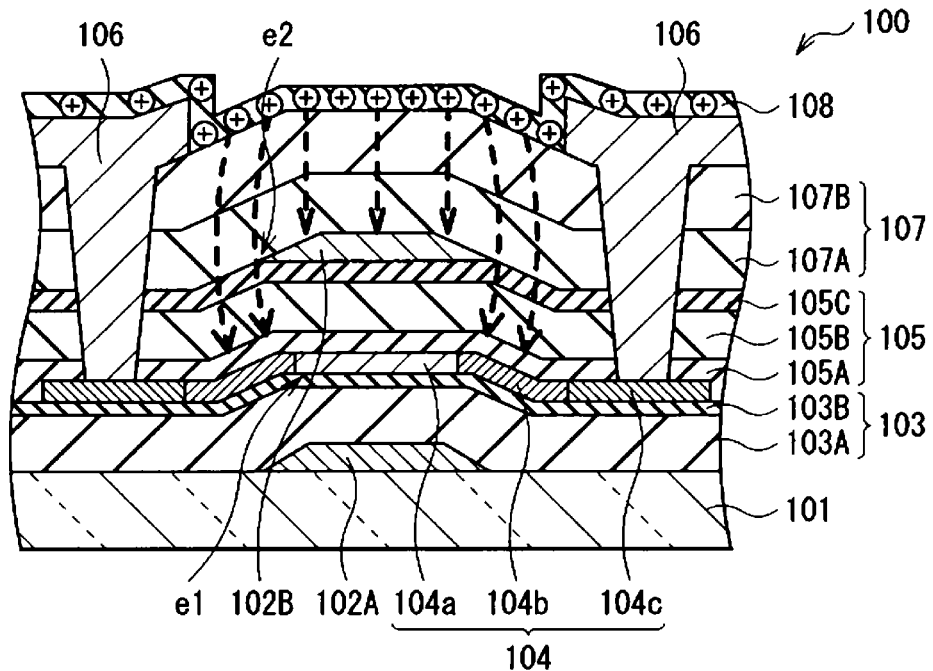
FIG. 7 is an explanatory model diagram to be referred to in description of an effect given by positive electric charge in a typical comparison transistor.

FIG. 7 is an explanatory cross-sectional diagram referred to in the following description of an effect given by positive electric charge in a typical comparison transistor 100 serving as a typical transistor provided for the purpose of comparison with the transistor 111B provided by the present disclosure. The comparison transistor 100 is also a transistor having a dual-gate structure. As shown in the figure, the comparison transistor 100 includes a gate electrode 102A, a first gate insulation film 103, a semiconductor layer 104, a second gate insulation film 105, a gate electrode 102B and a first interlayer insulation film 107 which are sequentially created on a substrate 101 in the same order as the order in which the gate electrode 102A, the first gate insulation film 103, the semiconductor layer 104, the second gate insulation film 105, the gate electrode 102B and the first interlayer insulation film 107 are enumerated in this sentence. The semiconductor layer 104 includes a channel layer 104a, an LDD layer 104b and an $N^+$ layer 104c. In the first interlayer insulation film 107 and the second gate insulation film 105, contact holes are provided. Source and drain electrodes 106 are connected to the semiconductor layer 104 through these contact holes. A second interlayer insulation film 108 is created on the source and drain electrodes 106 as well as on the first interlayer insulation film 107. In such a configuration, the first gate insulation film 103 is a laminated stack provided above the substrate 101 as a stack including a silicon-nitride film 103A and a silicon-oxide film 103B which are created above the substrate 101 sequentially in the same order as the order in which the silicon-nitride film 103A and the silicon-oxide film 103B are enumerated in this sentence. By the same token, the second gate insulation film 105 is a laminated stack provided above the substrate 101 as a stack including a silicon-oxide film 105A, a silicon-nitride film 105b and a silicon-oxide film 105C which are created above the substrate 101 sequentially in the same order as the order in which the silicon-nitride film 103A, the silicon-nitride film 105b and the silicon-oxide film 105C are enumerated in this sentence. In the same way, the first interlayer insulation film 107 is a laminated stack provided above the substrate 101 as a stack including a silicon-oxide film 107A and a silicon-nitride film 107B which are created above the substrate 101 sequentially in the same order as the order in which the silicon-oxide film 107A and the silicon-nitride film 107B are enumerated in this sentence.

In the transistor 100 serving as a typical comparison transistor, the silicon-oxide film 103B, the silicon-oxide film 105A, the silicon-oxide film 105C, the silicon-oxide film 107A and the second interlayer insulation film 108 which is also a silicon-oxide film are electrically charged with positive electric charge due to the reason described before. Among the silicon-oxide film 103B, the silicon-oxide film 105A, the silicon-oxide film 105C, the silicon-oxide film 107A and the second interlayer insulation film 108, for example, the positive electric charge in the second interlayer insulation film 108 has a worst effect on the semiconductor layer 104 as indicated by a model shown in FIG. 7. To be more specific, the positive electric charge accumulated in the second interlayer insulation film 108 has a very bad effect on a channel edge e1 as indicated by dashed-line arrows in the model shown in the same figure. Since the comparison transistor 100 has a dual-gate structure in this case, the positive electric charge accumulated in portions right above the gate electrode 102B is shielded by the gate electrode 102B so that the effect of this positive electric charge on the semiconductor layer 104 is reduced. In an area on an outer side outside an edge e2 of the gate electrode 102B, however, such a shielding effect cannot be obtained sufficiently. For example, in a gap between the gate electrode 102B and the drain and source electrodes 106, such a shielding effect cannot be obtained sufficiently. In addition, even though it is ideal to provide the gate electrode 102B at a position right above the gate electrode 102A, in actuality, it is difficult to adjust the position of the gate electrode 102B to the position of the gate electrode 102A with a high degree of precision. Thus, variations of the position of the gate electrode 102B are generated with ease. The variations of the position of the gate electrode 102B are each referred to as a position shift. If such a position shift exists, it is particularly difficult to sufficiently obtain the shielding effect for the channel edge e1.

For the reasons described above, the channel layer 126a or, in particular, the channel edge e1 is affected by positive electric charge with ease. Thus, the threshold voltage Vth is undesirably shifted to the negative side. In addition, if the semiconductor layer 104 is made of low-temperature polysilicon in particular, it is desirable to sandwich the semiconductor layer 104 between silicon-oxide films. Thus, in comparison with a configuration using amorphous silicon for example, the threshold voltage Vth cited above is shifted with ease. In addition, if the threshold voltage Vth is shifted, typically, the off current and the on current change, raising problems. To put it concretely, the off current increases, causing a current leak whereas the on current decreases, making it impossible to read out the signal electric charge. That is to say, it is difficult to sustain the reliability of the transistor 100.

Figure 8:
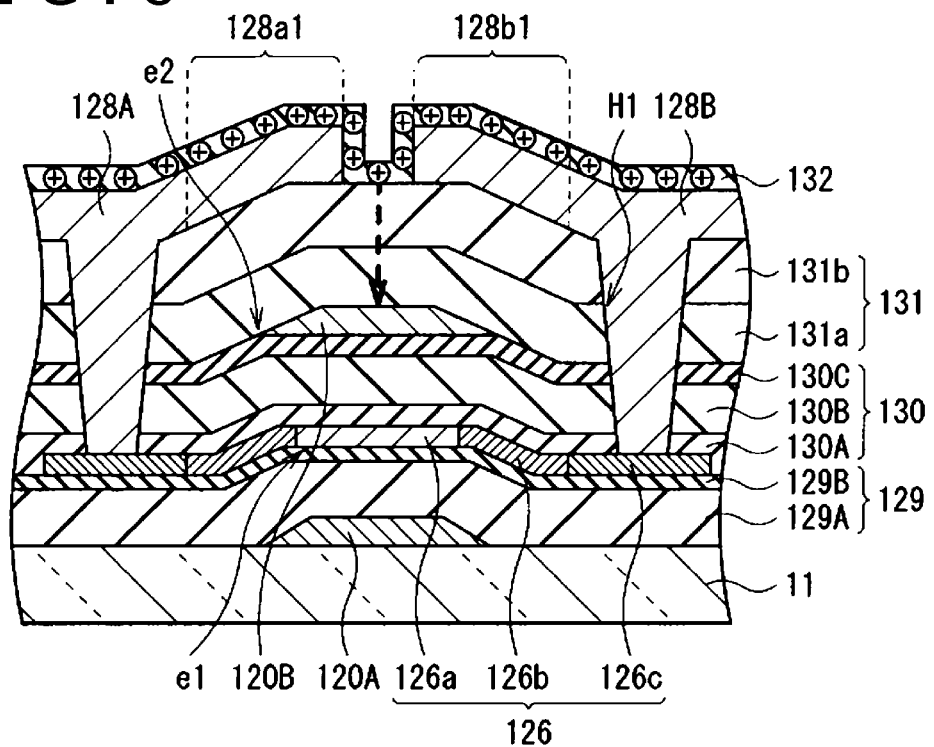
FIG. 8 is an explanatory model diagram to be referred to in description of an effect given by positive electric charge in the transistor shown in FIG. 4.

In the case of this embodiment, on the other hand, the shield electrode layers 128a1 and 128b1 are provided on the first interlayer insulation film 131. The shield electrode layers 128a1 and 128b1 are provided on the first interlayer insulation film 131 in such a way that portions of the shield electrode layers 128a1 and 128b1 face the edges e2 of the gate electrode 120B. That is to say, the shield electrode layers 128a1 and 128b1 are provided on the first interlayer insulation film 131 in such a way that the portions of the shield electrode layers 128a1 and 128b1 overlap the gate electrode 120B. Thus, as shown in the model of FIG. 8, in the first place, the shielding effect of the gate electrode 120B typically reduces the effect of positive electric charge accumulated in the second interlayer insulation film 132 made of silicon oxide on the channel layer 126a. In the second place, in this embodiment, the shielding effect of the shield electrode layers 128a1 and 128b1 represses the effect of positive electric charge on the channel edges e1.

Figure 9:
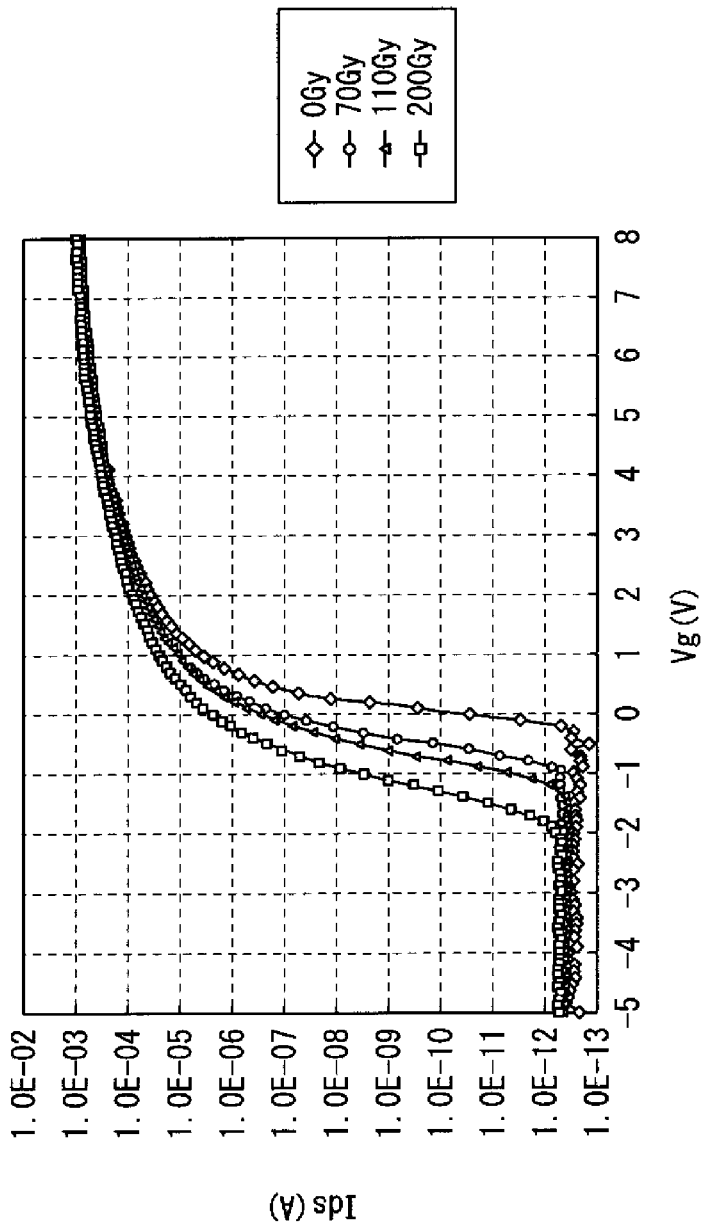
FIG. 9 is a diagram showing the effect of an X-ray radiation quantity on the current-voltage characteristic of the transistor shown in FIG. 4.
Figure 10:
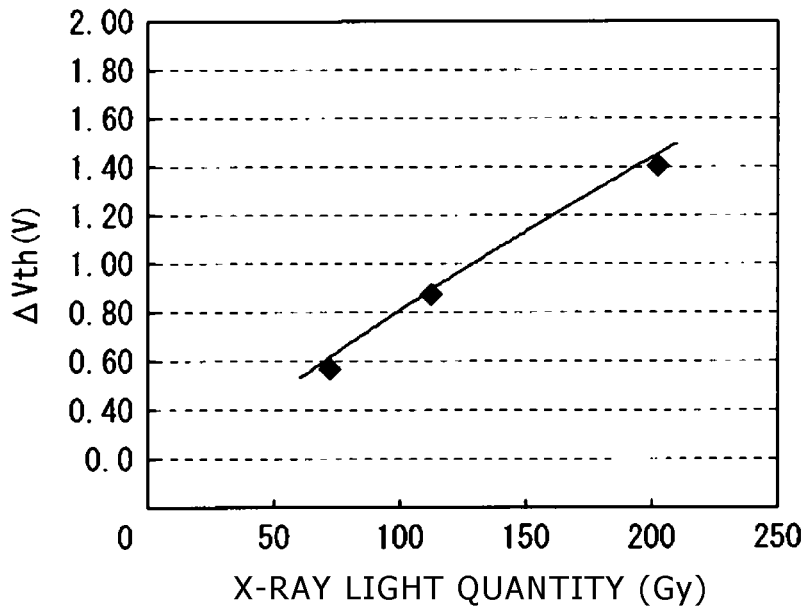
FIG. 10 is a characteristic diagram showing a relation between the X-ray radiation quantity and the threshold-voltage shift of the transistor shown in FIG. 4.

FIG. 9 is a diagram showing the effect of an X-ray radiation quantity of on the current-voltage characteristic of the transistor 111B including the semiconductor layer 126 made of low-temperature polysilicon for a case in which an X ray is radiated to the transistor 111B. The current-voltage characteristic of the transistor 111B is a relation between the gate voltage Vg and the drain current Ids. The current-voltage characteristic has been obtained for a source-drain voltage of 6.1 V, a width W of 20.5 microns and a length L of 6 microns. In addition, FIG. 10 is a characteristic diagram showing a relation between the X-ray radiation quantity and the shift quantity (ΔVshift) of a reference voltage which is a voltage Vg with the drain current Ids of 1.0 e-11 A taken as a reference. On the other hand, FIG. 11 is a characteristic diagram showing also a relation between the X-ray radiation quantity and the S value (or the threshold value).

Figure 11:
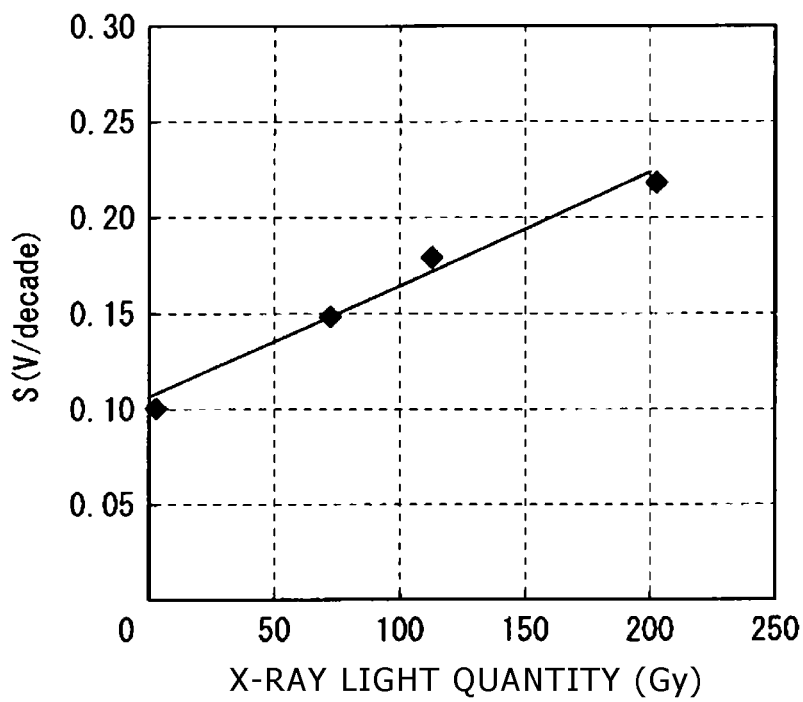
FIG. 11 is a characteristic diagram showing a relation between the X-ray radiation quantity and the S value in the current-voltage characteristic of the transistor shown in FIG. 4.

It is to be noted that the curves shown in FIGS. 9, 10 and 11 are curves obtained for an X-ray tube voltage of 90 kV and X-ray radiation quantities of 0 Gy, 70 Gy, 110 Gy and 200 Gy. In addition, instead of measuring the shift quantity of the voltage Vg (that is, the threshold voltage Vth) with the drain current Ids of 5.0 e-7 A taken as a reference, the shift quantity (ΔVshift) of the voltage Vg with the drain current Ids of 1.0 e-11 A taken as a reference is measured in order to show this shift quantity in a more easily understood way.

As is obvious from the curves, if an X ray is radiated to the transistor 111B, as the radiation quantity of the X ray is increased from 0 Gy to 200 Gy through 70 Gy and 110 Gy, the shift ΔVth of the threshold voltage Vth of the transistor 111B shows a gradually rising trend. However, the curves represent good characteristics.

In the embodiment described above, in any of the silicon-oxide films included in the second gate insulation film 129, the first gate insulation film 130, the first interlayer insulation film 131 and the second interlayer insulation film 132 which are employed in the transistor 111B, holes are generated by radiation of a radioactive ray so that positive electric charge is accumulated in the second gate insulation film 129, the first gate insulation film 130, the first interlayer insulation film 131 and the second interlayer insulation film 132. However, the shield electrode layers 128a1 and 128b1 are provided on the first interlayer insulation film 131 in such a way that portions of the shield electrode layers 128a1 and 128b1 face the edges e2 of the gate electrode 120B. Thus, particularly in the vicinity of the channel edge e1 of the semiconductor layer, for example, the effect of the positive electric charge accumulated in the second interlayer insulation film 132 is reduced so that the shift ΔVth of the threshold voltage Vth can be repressed. As a result, it is possible to repress characteristic deteriorations attributed to the radiation of the radioactive ray and, therefore, improve the reliability of the transistor 111B.

In addition, in this embodiment, the source and drain electrodes 128A and 128B function also as the shield electrode layers 128a1 and 128b1 so that, in the process of patterning the source and drain electrodes 128A and 128B, the shield electrode layers 128a1 and 128b1 can be created with ease.

First Typical Modification

Figure 12A:
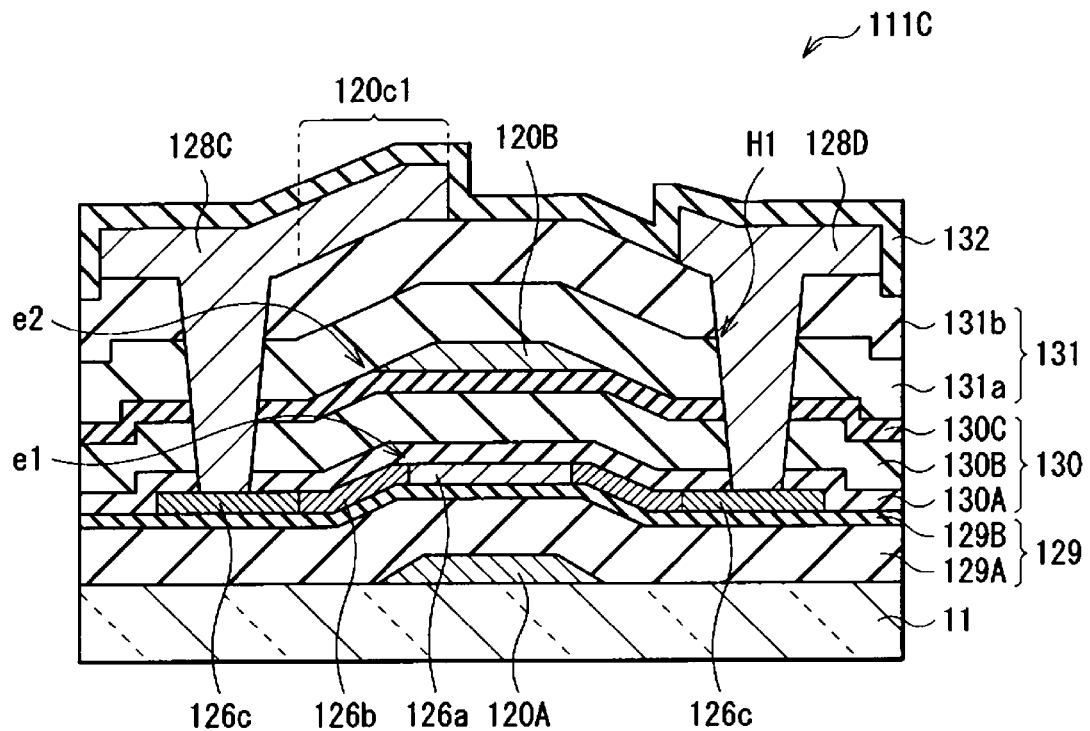
FIGS. 12A and 12B are cross-sectional diagrams showing a rough configuration of a transistor according to first typical modification.
Figure 12B:
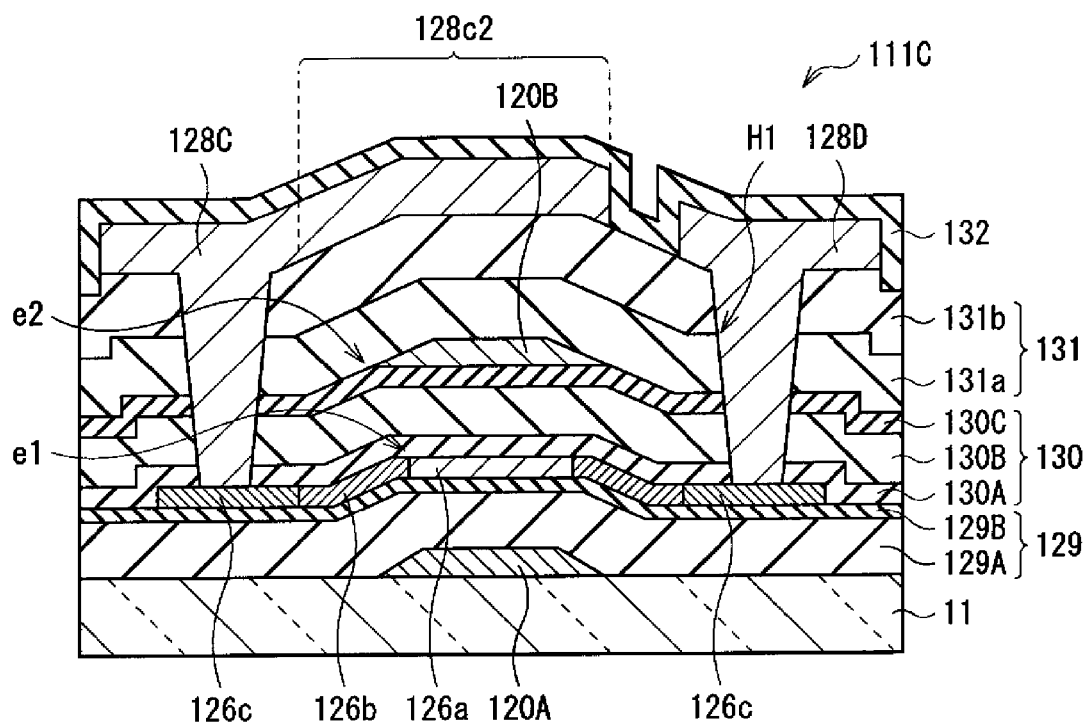

The first embodiment described so far has a structure in which the two shield electrode layers 128a1 and 128b1 are provided on both the sides of the channel by making use of portions of both the source and drain electrodes 128A and 128B. As shown in FIGS. 12A and 12B, however, a shield electrode layer can also be provided only on one side of the channel. FIGS. 12A and 12B are cross-sectional diagrams showing a rough configuration of a transistor 111C according to first typical modification which is typical modification of the first embodiment described above. Much like the transistor 111B according to the first embodiment described above, the transistor 111C also referred to hereafter as a first modified version is a transistor having a dual-gate structure having the semiconductor layer 126 between the two gate electrodes 120A and 120B. In addition, the second gate insulation film 129, the first gate insulation film 130, the first interlayer insulation film 131 and the second interlayer insulation film 132 each include a silicon-oxide film. It is to be noted that, in the transistor 111C described below, each configuration element identical with its counterpart employed in the first embodiment described above is denoted by the same reference numeral as the counterpart and the explanation of the identical configuration element is properly omitted.

In this first modified version, however, a drain electrode 128C functioning only as the drain electrode and a source electrode 128D functioning only as the source electrode are connected electrically to the semiconductor layer 126 on the first interlayer insulation film 131. In addition, among the channel layer 126a, the LDD layer 126b and the N$^+$ layer 126c which are included in the semiconductor layer 126, the LDD layer 126b is provided only on the side close to the drain electrode 128C. This is because, since the functions of the source and drain electrodes are not swapped with each other between the drain electrode 128C and the source electrode 128D in the transistor 111C for example, it is nice to provide the LDD layer 126b only on the side close to the drain electrode 128C, the voltage supplied to which is relatively high. Since the source electrode 128D is sustained at the electric potential of the ground in some cases, the LDD layer 126b does not have to be provided on the side close to the source electrode 128D.

In such a configuration, a portion of the drain electrode 128C functions also as a shield electrode layer 128c1 and a portion of the shield electrode layer 128c1 is provided to face the edge e2 of the gate electrode 120B. Even if positive electric charge is accumulated in, for example, the second interlayer insulation film 132 due to the reasons explained before, the shielding effect of the shield electrode layer 128c1 reduces the effect of the positive electric charge on the channel layer 126a provided on the drain side of the semiconductor layer 126. In particular, the shielding effect of the shield electrode layer 128c1 reduces the effect of the positive electric charge on the channel edge e2. On the source side of the semiconductor layer 126, on the other hand, the current is not so large as the current on the drain side of the semiconductor layer 126. Thus, the LDD layer is not required on the source side of the semiconductor layer 126. In addition, even if the shield electrode layer does not exist, there is hardly an effect, which is as large as that on the drain side of the semiconductor layer 126, on the threshold voltage Vth. It is thus possible to provide a configuration in which the shield electrode layer 128c1 is provided only on one side of the channel, that is, only on the drain side in particular. In such a configuration, the shield electrode layer 128c1 can be provided efficiently on a portion which can easily have an effect on the characteristic.

The first modified version described above has a configuration in which the shield electrode layer 128c1 is provided only on the drain side. It is to be noted, however, that the shield electrode layer 128c1 can also be provided only on the source side. In this case, the shielding effect of the shield electrode layer 128c1 is small in comparison with the configuration in which the shield electrode layer 128c1 is provided on the drain side. In comparison with the structure of the typical comparison transistor in which the shield electrode layer is not provided at all, nevertheless, it is possible to reduce the effect of the positive electric charge on the channel edge e1 and, thus, repress the shift of the threshold voltage Vth.

In addition, in the first modified version, the LDD layer 126b is provided only on the drain side of the channel layer 126a. However, the LDD layer 126b can be provided also on the source side. In the case of such a structure, the shield electrode layer 128c1 can be provided only on either the drain side or the source side.

In addition, as shown in FIG. 12B, the drain electrode 128C is created by being extended to positions covering both edges of the gate electrode 120B so that a portion of the drain electrode 128C also functions as the shield electrode layer 128c2.

Second Embodiment

Configuration

Figure 13:
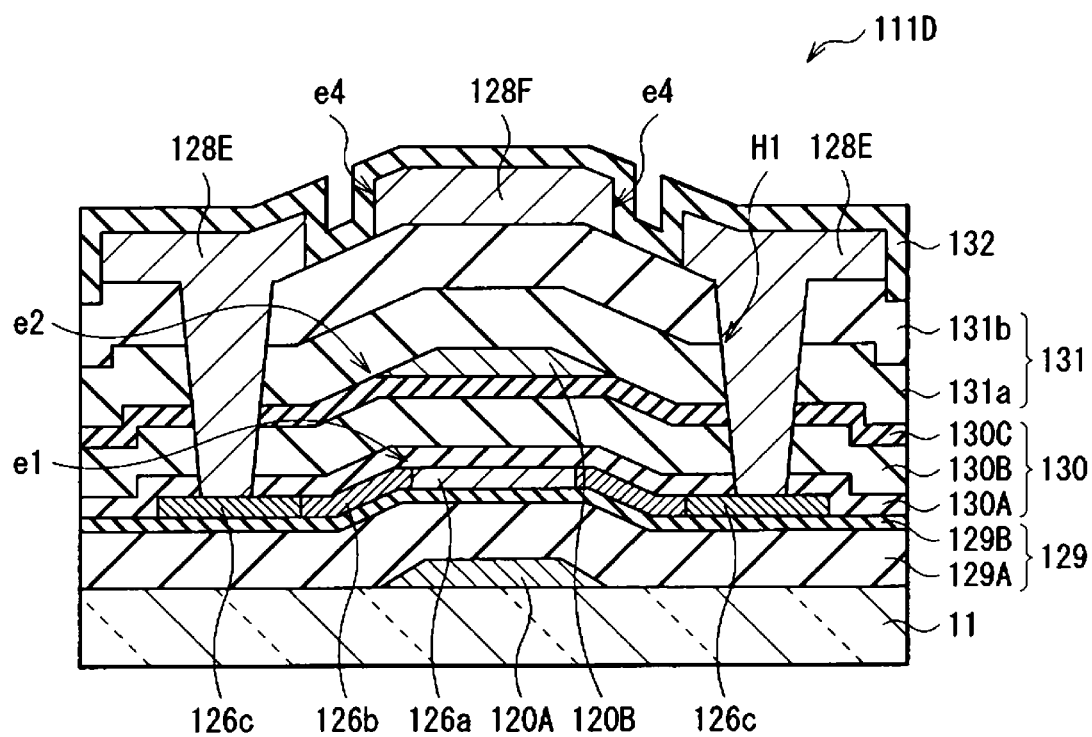
FIG. 13 is a cross-sectional diagram showing a rough configuration of a transistor according to a second embodiment of the present disclosure.

FIG. 13 is a cross-sectional diagram showing a rough configuration of a transistor 111D according to a second embodiment of the present disclosure. It is to be noted that, in the transistor 111C described below, each configuration element identical with its counterpart employed in the first embodiment described above is denoted by the same reference numeral as the counterpart and the explanation of the identical configuration element is properly omitted. In addition, in the same way as the transistor 111B according to the first embodiment, the transistor 111D according to the second embodiment is included in the pixel circuit 12a of the pixel section 12 employed in the radioactive-ray imaging apparatus explained in the description of the first embodiment along with the photodiode 111A.

Much like the transistor 111B according to the first embodiment described above, the transistor 111D is a transistor having a dual-gate structure including the semiconductor layer 126 between the two gate electrodes 120A and 120B. In addition, the second gate insulation film 129, the first gate insulation film 130, the first interlayer insulation film 131 and the second interlayer insulation film 132 each include a silicon-oxide film. On top of that, a pair of source and drain electrodes 128E connected electrically to the semiconductor layer 126 are provided on the first interlayer insulation film 131.

In the case of this embodiment, however, a shield electrode layer 128F is electrically separated from the source and drain electrodes 128E and also provided on the first interlayer insulation film 131. In the same way as the source and drain electrodes 128A and 128B employed in the first embodiment, the source and drain electrodes 128E are capable of swapping the functions the source and drain electrodes with each other. In addition, the source and drain electrodes 128E are made of the same material as the source and drain electrodes 128A and 128B.

In the same way as the shield electrode layers 128a1 and 128b1 employed in the first embodiment, the shield electrode layer 128F functions as an electrical shield for repressing the effect of positive electric charge accumulated in a silicon-oxide film on the semiconductor layer 126. In addition, the shield electrode layer 128F is provided in such a way that at least a portion of the shield electrode layer 128F faces the edge e2 of the gate electrode 120B. To put it concretely, the shield electrode layer 128F is provided in such a way that the shield electrode layer 128F faces the gate electrode 120B and a portion of the shield electrode layer 128F overlaps the edge e2 of the gate electrode 120B. It is to be noted that the positions of the edges e4 of the shield electrode layer 128F are not limited to specific positions in particular as described above. However, it is nice to provide a desirable structure in which the shield electrode layer 128F is provided to cover the entire taper portions of the gate electrode 120B in the same way as the first embodiment described above.

The shield electrode layer 128F can be made of typically the same material as the source and drain electrodes 128A and 128B employed in the first embodiment. In addition, the material used for making the shield electrode layer 128F can be the same as that for the source and drain electrodes 128E or different from that for the source and drain electrodes 128E. If the material used for making the shield electrode layer 128F is the same as that for the source and drain electrodes 128E, the shield electrode layer 128F and the source and drain electrodes 128E can be created in the same process at the same time.

Such a shield electrode layer 128F can be electrically connected to typically the gate electrode 120A and/or the gate electrode 120B by making use of typically wiring layers not shown in the figure so that the electric potential appearing at the shield electrode layer 128F can be sustained at the same level as the electric potential appearing at the gate electrode 120A and/or the gate electrode 120B. As an alternative, the shield electrode layer 128F can be electrically disconnected from the gate electrode 120A and the gate electrode 120B so that the electric potential appearing at the shield electrode layer 128F can be sustained at an arbitrary level set differently from the electric potentials appearing at the gate electrode 120A and the gate electrode 120B. As another alternative, the shield electrode layer 128F can be sustained at the electric potential of the ground or can be put in a state of being floated.

Effects of the Second Embodiment

In the radioactive-ray imaging apparatus employing the transistors 111D according to this embodiment as described above, electrical signals conveying information are obtained on the basis of radioactive rays which are typically X rays. However, radioactive rays directly incident to the transistors 111D exist. In each of the transistors 111D, the second gate insulation film 129, the first gate insulation film 130, the first interlayer insulation film 131 and the second interlayer insulation film 132 each has a silicon-oxide film. If a radioactive ray hits the silicon-oxide film containing such oxygen, positive electric charge is accumulated in the silicon-oxide film due to the reasons explained earlier and the electric charge undesirably shifts the threshold voltage Vth to the negative side.

Figure 14:
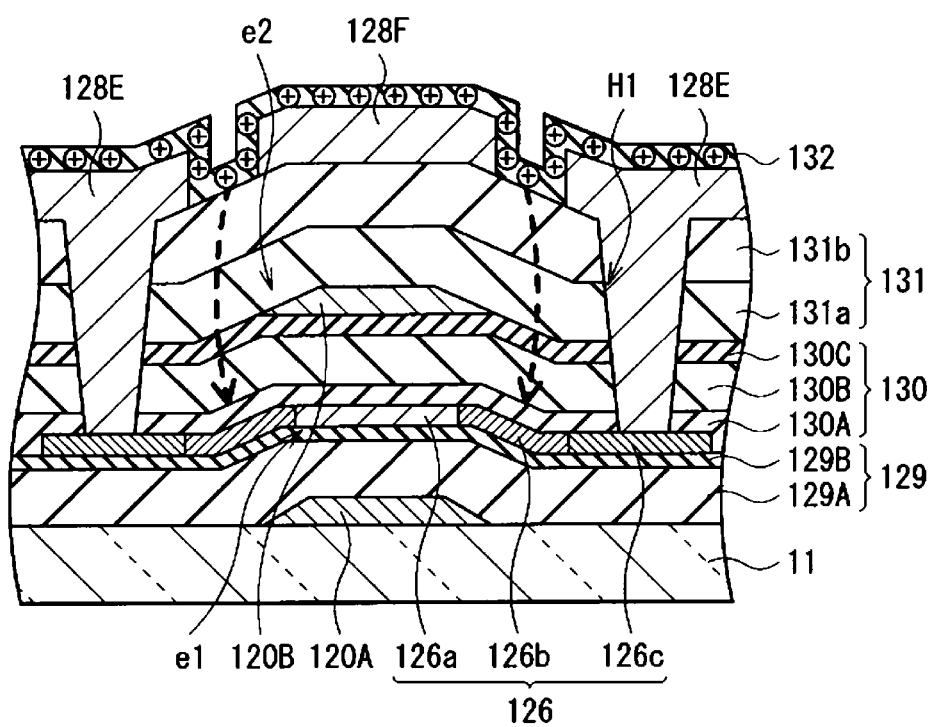
FIG. 14 is an explanatory model diagram to be referred to in description of the effect of positive electric charge in the transistor shown in FIG. 13.

In order to solve the problem described above, in this embodiment, the shield electrode layer 128F is provided on the first interlayer insulation film 131 in such a way that a portion of the shield electrode layer 128F faces or overlaps the edge e2 of the gate electrode 120B. Thus, as shown by a model in FIG. 14, in the first place, the shielding effect of the gate electrode 120B represses the effect of the positive electric charge accumulated typically in the second interlayer insulation film 132 including a silicon-oxide film on the channel layer 126a. In the second place, in the case of this embodiment, the shielding effect of the shield electrode layer 128F represses the effect of the positive electric charge on the channel layer 126a or, in particular, on the channel edge e1 in comparison with the typical comparison structure shown in FIG. 7.

Figure 15:
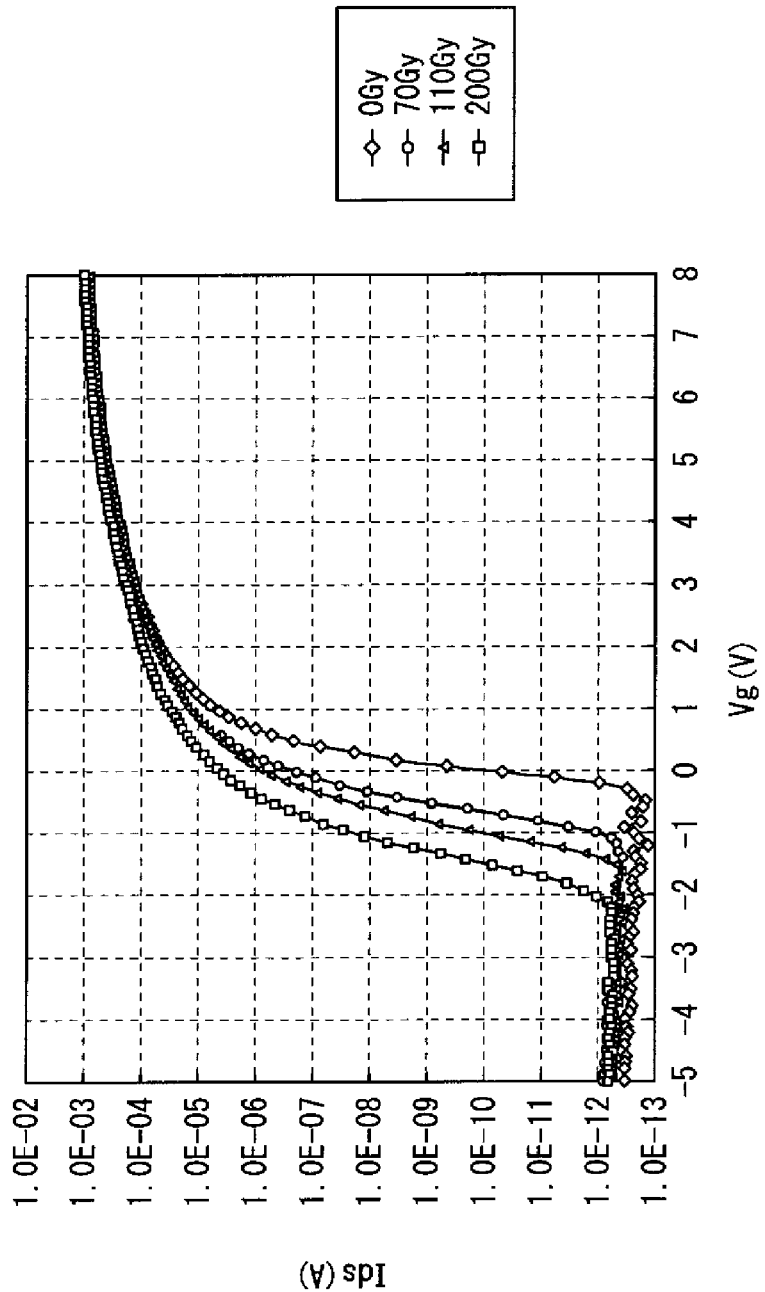
FIG. 15 is a diagram showing the effect of the X-ray radiation quantity on the current-voltage characteristic of the transistor shown in FIG. 13.

FIG. 15 is a diagram showing the effect of the X-ray radiation quantity on the current-voltage characteristic of the transistor 111D including the semiconductor layer 126 made of low-temperature polysilicon for a case in which an X ray is radiated to the transistor 111D. The current-voltage characteristic of the transistor 111D is a relation between the gate voltage Vg and the drain current Ids.

Figure 16:
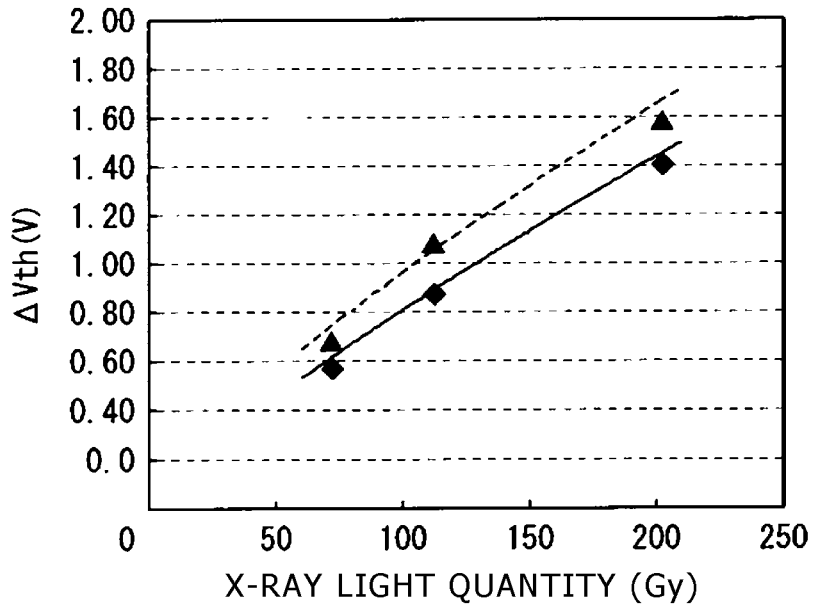
FIG. 16 is a characteristic diagram showing a relation between the X-ray radiation quantity and the threshold-voltage shift for each of the transistors shown in FIG. 13.

FIG. 16 is a characteristic diagram showing a relation between the X-ray radiation quantity and the shift quantity ($\Delta$Vshift) of a reference voltage which is a voltage Vg with the drain current Ids of 1.0 e-11 A taken as a reference. On the other hand, FIG. 17 is a characteristic diagram showing a relation between the X-ray radiation quantity and the S value (or the threshold value) in the current-voltage characteristic for each of the transistors 111B and 111D according to the first and second embodiments respectively.

Figure 17:
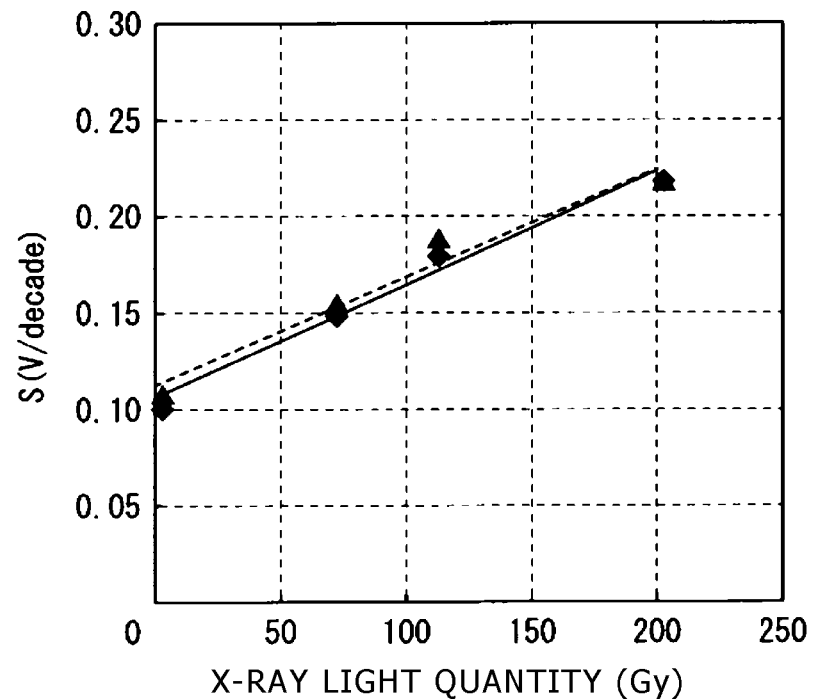
FIG. 17 is a characteristic diagram showing a relation between the X-ray radiation quantity and the S value in the current-voltage characteristic for each of the transistors shown in FIG. 13.

It is to be noted that the curves shown in FIGS. 15, 16 and 17 are curves obtained for an X-ray tube voltage of 90 kV and X-ray radiation quantities of 0 Gy, 70 Gy, 110 Gy and 200 Gy. In addition, in the case of FIGS. 16 and 17, every solid line represents measurement results for the transistor 111B according to the first embodiment whereas each dashed-line represents measurement results for the transistor 111D according to the second embodiment. As is obvious from the curves for the transistors 111B and 111D according to the first and second embodiments respectively, if an X ray is radiated to the transistor 111D, as the radiation quantity of the X ray is increased from 0 Gy to 200 Gy through 70 Gy and 110 Gy, the shift ΔVth of the threshold voltage Vth of the transistor 111D shows a gradually rising trend. However, the curves represent good characteristics.

In the second embodiment described above, in any of the silicon-oxide films included in the second gate insulation film 129, the first gate insulation film 130, the first interlayer insulation film 131 and the second interlayer insulation film 132 which are employed in the transistor 111D, holes are generated by radiation of a radioactive ray so that positive electric charge is accumulated in the second gate insulation film 129, the first gate insulation film 130, the first interlayer insulation film 131 and the second interlayer insulation film 132. However, the shield electrode layer 128F is provided on the first interlayer insulation film 131 in such a way that portions of the shield electrode layers 128F face the edges e2 of the gate electrode 120B. Thus, particularly in the vicinity of the channel edge e1 of the semiconductor layer, for example, the effect of the positive electric charge accumulated in the second interlayer insulation film 132 is reduced so that the shift ΔVth of the threshold voltage Vth can be repressed. As a result, it is possible to obtain the same effects as the first embodiment.

Second Typical Modification

Figure 18:
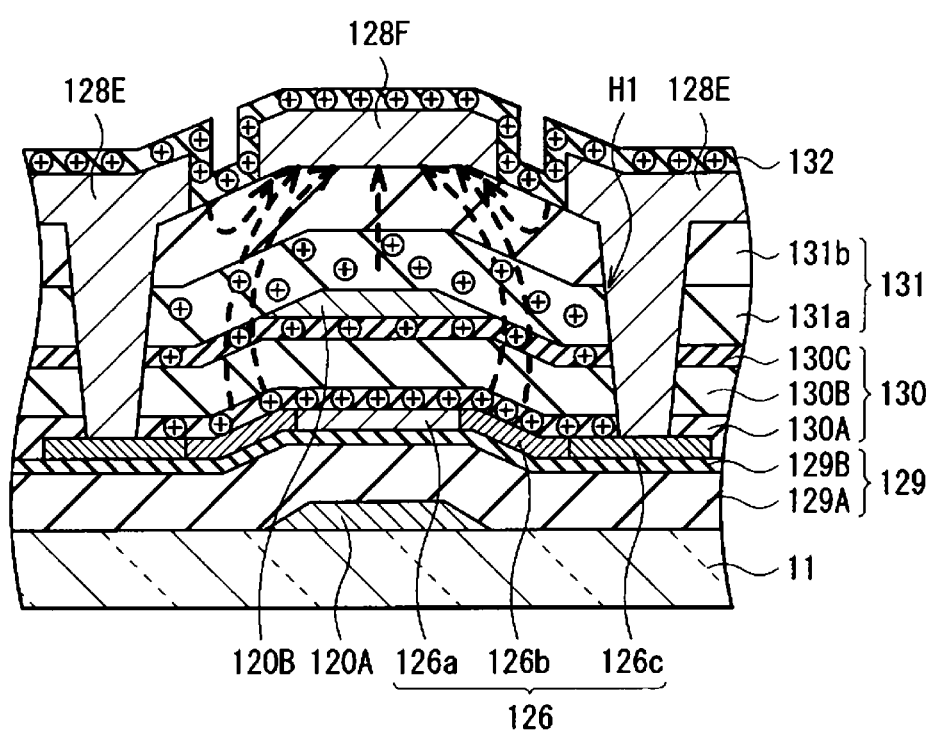
FIG. 18 is an explanatory cross-sectional diagram to be referred to in description of a rough configuration of the transistor according to second modification and the effect of positive electric charge in the transistor.

In the case of the configuration adopted by the second embodiment described above, the shield electrode layer 128F is provided by electrically separating the shield electrode layer 128F from the source and drain electrodes 128E so that the shield electrode layer 128F can be held at the gate or ground electric potential. In accordance with second typical modification, however, the shield electrode layer 128F can also be held at a negative electric potential as well. In this case, as shown by a model in FIG. 18, positive electric charge is accumulated in the silicon-oxide films of the second gate insulation film 129, the first gate insulation film 130, the first interlayer insulation film 131 and the second interlayer insulation film 132 due to radiation of radioactive rays to the second gate insulation film 129, the first gate insulation film 130, the first interlayer insulation film 131 and the second interlayer insulation film 132 respectively. Since the shield electrode layer 128F is held at a negative electric potential in the case of a second modified version according to the second typical modification, however, the positive electric charge accumulated in the silicon-oxide films of the second gate insulation film 129, the first gate insulation film 130, the first interlayer insulation film 131 and the second interlayer insulation film 132 is attracted to the shield electrode layer 128F so that the effect of the positive electric charge on the channel layer 126a is reduced. As a result, it is possible to obtain the same effects as the second embodiment.

As described above, in the second modified version of the second embodiment, the shield electrode layer 128F is provided between the first interlayer insulation film 131 and the second interlayer insulation film 132. It is to be noted, however, that the location of the shield electrode layer 128F is by no means limited to a position between the first interlayer insulation film 131 and the second interlayer insulation film 132. For example, the shield electrode layer 128F can also be inserted into a position between the silicon-oxide film 131a and the silicon-nitride film 131b which are included in the first interlayer insulation film 131.

The following description explains third to fifth typical modifications which are modifications of the first and second embodiments. It is to be noted that, in the description of the third to fifth typical modifications described below, each configuration element identical with its counterpart employed in the first and/or embodiments described above is denoted by the same reference numeral as the counterpart and the explanation of the identical configuration element is properly omitted.

Third Modification

Figure 19:
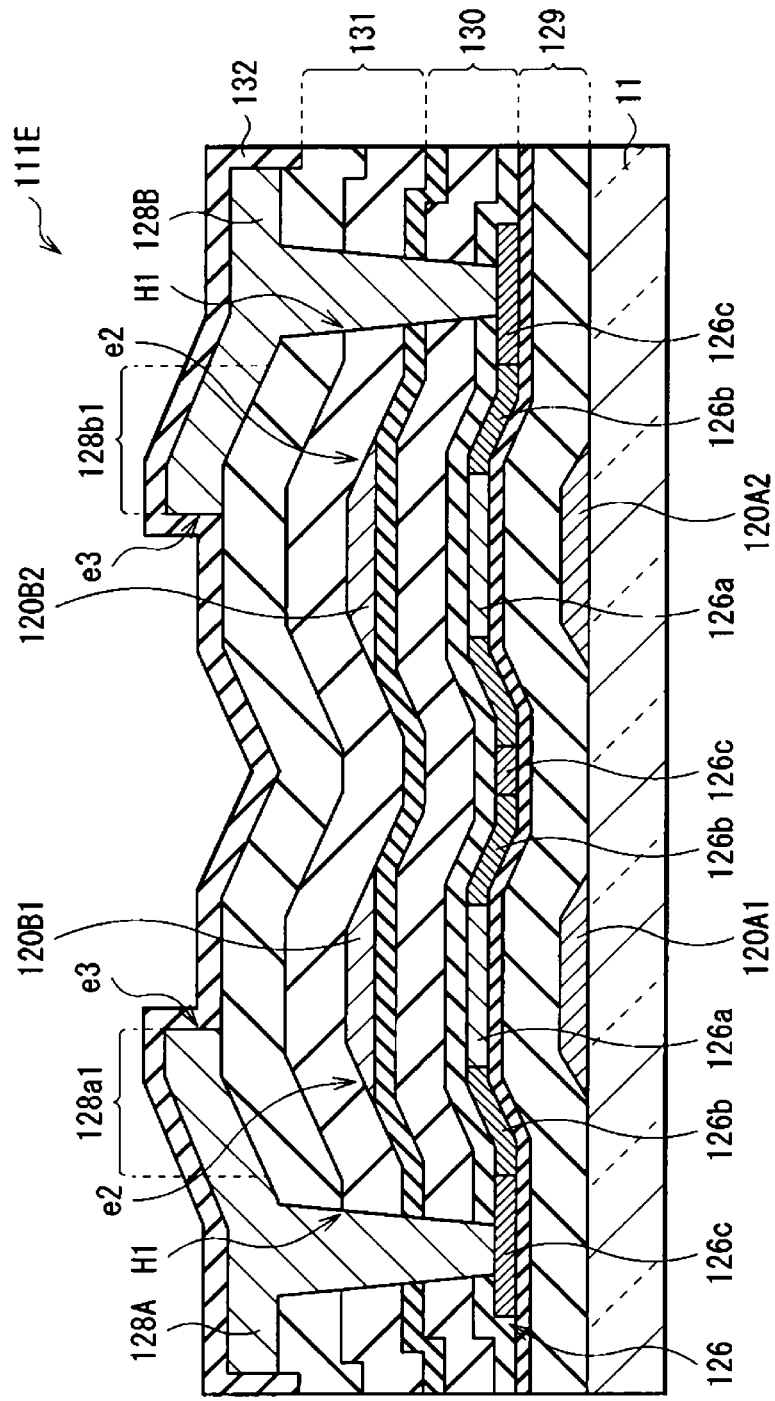
FIG. 19 is a cross-sectional diagram showing a rough configuration of a transistor according to third typical modification.

FIG. 19 is a cross-sectional diagram showing a rough configuration of a third modified version which is a transistor 111E according to third typical modification. In the same way as the transistor 111B according to the first embodiment, the transistor 111E is included in the pixel circuit 12a of the pixel section 12 employed in the radioactive-ray imaging apparatus along with the photodiode 111A. In addition, the transistor 111E also has a dual-gate structure having the semiconductor layer 126 between two gate electrodes. On top of that, each of the second gate insulation film 129, the first gate insulation film 130, the first interlayer insulation film 131 and the second interlayer insulation film 132 includes a silicon-oxide film. Furthermore, a pair of source and drain electrodes 128A and 128B electrically connected to the semiconductor layer 126 are provided on the first interlayer insulation film 131.

In this third modified version, however, two laminated structures each having the dual-gate structure described above are provided in parallel to each other in one transistor 111E. To put it concretely, the transistor 111E has two gate electrodes in selective areas on the substrate 11. The two electrodes are gate electrodes 120A1 and 120A2. The second gate insulation film 129 is provided to cover the gate electrodes 120A1 and 120A2. On the second gate insulation film 129, the semiconductor layer 126 is provided. The semiconductor layer 126 includes the channel layer 126a, the LDD layer 126b and the $N^+$ layer 126c for every pair of gate electrodes 120A1 and 120A2. The first gate insulation film 130 is created to cover the semiconductor layer 126. In selective areas on the first gate insulation film 130, gate electrodes 120B1 and 120B2 are provided. The selective areas on the first gate insulation film 130 are areas facing the gate electrodes 120A1 and 120A2 respectively. The first interlayer insulation film 131 is created to cover the gate electrodes 120B1 and 120B2. Contact holes H1 are each provided in portions of the first interlayer insulation film 131 and the first gate insulation film 130. In the same way as the transistor 111B according to the first embodiment, a pair of source and drain electrodes 128A and 128B are provided on the first interlayer insulation film 131 to fill up the contact holes H1 in a state of being electrically connected to the semiconductor layer 126. The second interlayer insulation film 132 is provided on the source and drain electrodes 128A and 128B. It is to be noted that, by providing the gate electrodes 120A1 and 120A2 as well as the gate electrodes 120B1 and 120B2 within one transistor in parallel to each other as is the case with this modified version, it is possible to decrease the magnitude of an off leak current which is a leak current at Vg=0 V.

It is to be noted that, in this embodiment, the gate electrodes 120B1 and 120B2 are concrete examples of the first gate electrode according to the embodiment of the present disclosure whereas the gate electrodes 120A1 and 120A2 are concrete examples of the second gate electrode according to the embodiment of the present disclosure.

In the same way as the transistor 111B, in the transistor 111E having such two dual-gate structures in accordance with this typical modification, portions of the source and drain electrodes 128A and 128B function also as the shield electrode layers 128a1 and 128b1. In this configuration, typically, the shield electrode layer 128a1 is provided in such a way that at least a portion of the shield electrode layer 128a1 faces the edge e2 of the gate electrode 120B1 whereas the shield electrode layer 128b1 is provided in such a way that at least a portion of the shield electrode layer 128b1 faces the edge e2 of the gate electrode 120B2. Even though the positions of the edges e3 of the shield electrode layers 128a1 and 128b1 are not limited to specific positions in particular as described above, it is nice to provide a desirable structure in which the shield electrode layers 128a1 and 128b1 are provided to cover the taper portions of the gate electrodes 120B1 and 120B2.

As described above, also in the transistor 111E having such two dual-gate structures provided in parallel to each other, the shielding effect of the shield electrode layers 128a1 and 128b1 allows the same effects as the first embodiment to be obtained.

Figure 20:
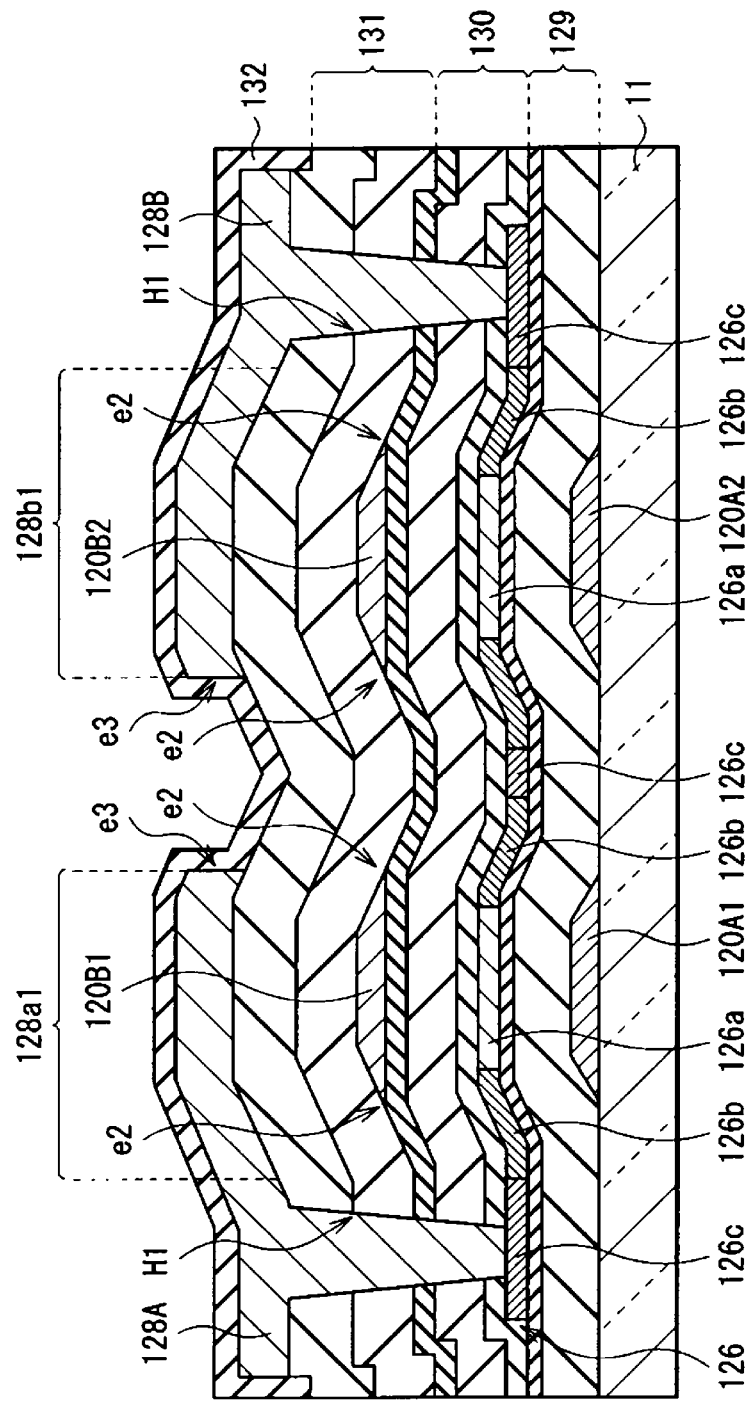
FIG. 20 is a cross-sectional diagram showing another example of the transistor shown in FIG. 19.

In the third modified version described above, the shield electrode layers 128a1 and 128b1 are provided on both sides of the source and drain electrodes 128A and 128B. It is to be noted, however, that the shield electrode layer can also be provided only on either the source electrode or the drain electrode as explained before in the description of the first modified version. In addition, FIG. 19 shows a case in which the shield electrode layers 128a1 and 128b1 are provided to face only the edges e2 on one sides of the gate electrodes 120B1 and 120B2. However, the following configuration can also be provided. For example, as shown in FIG. 20, the shield electrode layers 128a1 and 128b1 can also be provided by extending the shield electrode layers 128a1 and 128b1 so that the shield electrode layers 128a1 and 128b1 face the edges e2 on both sides of the gate electrodes 120B1 and 120B2.

Fourth Typical Modification

Figure 21:
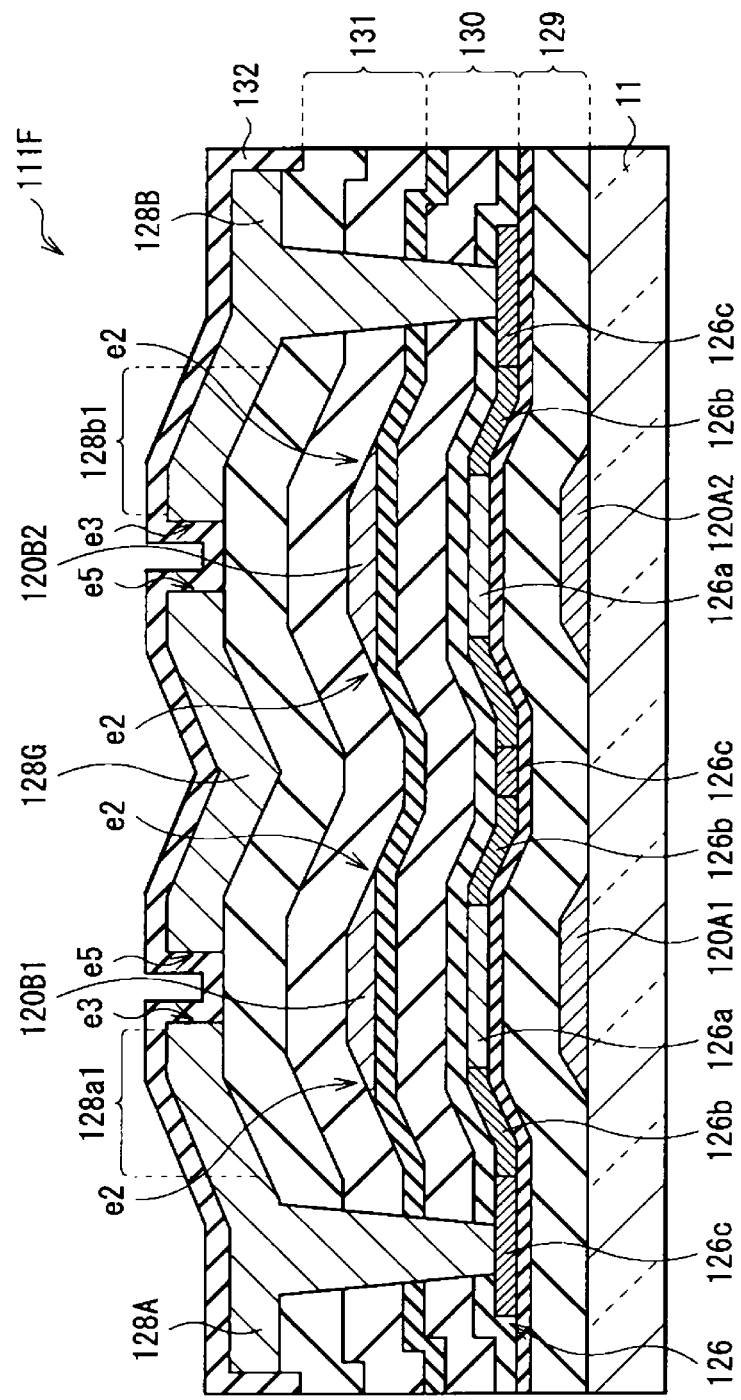
FIG. 21 is a cross-sectional diagram showing a rough configuration of a transistor according to fourth typical modification.

FIG. 21 is a cross-sectional diagram showing a rough configuration of a transistor 111F provided in accordance with fourth typical modification to serve as a fourth modified version. In the same way as the transistor 111B according to the first embodiment, the transistor 111F is included in the pixel circuit 12a of the pixel section 12 employed in the radioactive-ray imaging apparatus along with the photodiode 111A. In addition, the transistor 111F also has a dual-gate structure having the semiconductor layer 126 between two gate electrodes. On top of that, each of the second gate insulation film 129, the first gate insulation film 130, the first interlayer insulation film 131 and the second interlayer insulation film 132 includes a silicon-oxide film. Furthermore, a pair of source and drain electrodes 128A and 128B electrically connected to the semiconductor layer 126 are provided on the first interlayer insulation film 131.

Also in the transistor 111F having two dual-gate structures in accordance with the fourth typical modification in the same way as the third modified version, portions of the source and drain electrodes 128A and 128B function also as the shield electrode layers 128a1 and 128b1.

In this fourth modified version, however, a shield electrode layer 128G is further provided on the first interlayer insulation film 131. For example, the shield electrode layer 128G is provided in an area between the source and drain electrodes 128A and 128B on the first interlayer insulation film 131, being separated electrically from the source and drain electrodes 128A and 128B.

In the same way as the shield electrode layers 128a1 and 128b1 employed in the first embodiment, the shield electrode layer 128G functions as an electrical shield for repressing the effect of positive electric charge accumulated in a silicon-oxide film on the semiconductor layer 126. In addition, the shield electrode layer 128G is provided in such a way that at least a portion of the shield electrode layer 128F faces the edges e2 of the gate electrodes 120B1 and 120B2. It is to be noted that the positions of the edges e5 of the shield electrode layer 128G are not limited to specific positions in particular as described above. However, it is nice to provide a desirable structure in which the shield electrode layer 128G is provided to cover the entire taper portions of the gate electrodes 120B1 and 120B2.

The shield electrode layer 128G can be made of typically the same material as the source and drain electrodes 128A and 128B employed in the first embodiment. In addition, the material used for making the shield electrode layer 128G can be the same as that for the source and drain electrodes 128A and 128B or different from that for the source and drain electrodes 128A and 128B.

It is to be noted that, for example, the shield electrode layer 128G can be electrically connected by making use of typically a wiring layer not shown in the figure to at least one of typically the gate electrodes 120A1 and 120A2 and the gate electrodes 120B1 and 120B2 in order to sustain the shield electrode layer 128G at the same electric potential as the gate electrodes 120A1 and 120A2 and the gate electrodes 120B1 and 120B2. As an alternative, the shield electrode layer 128G can be electrically disconnected from the gate electrodes 120A1 and 120A2 as well as from the gate electrodes 120B1 and 120B2 so that the electric potential appearing at the shield electrode layer 128G can be sustained at an arbitrary level set differently from the electric potentials appearing at the gate electrodes 120A1 and 120A2 as well as the gate electrodes 120B1 and 120B2. As another alternative, the shield electrode layer 128G can be sustained at the electric potential of the ground or can be put in a state of being floated.

As described above, also in the transistor 111F having such two dual-gate structures provided in parallel to each other, the shielding effect of the shield electrode layers 128a1 and 128b1 allows the same effects as the first embodiment to be obtained. In addition, in this transistor 111F, the shield electrode layer 128G is further provided between the source and drain electrodes 128A and 128B so that it is possible to improve the shielding effect to a level higher than the third modified version and, thus, further reduce the effect of holes on the semiconductor layer 126.

Fifth Typical Modification

Figure 22:
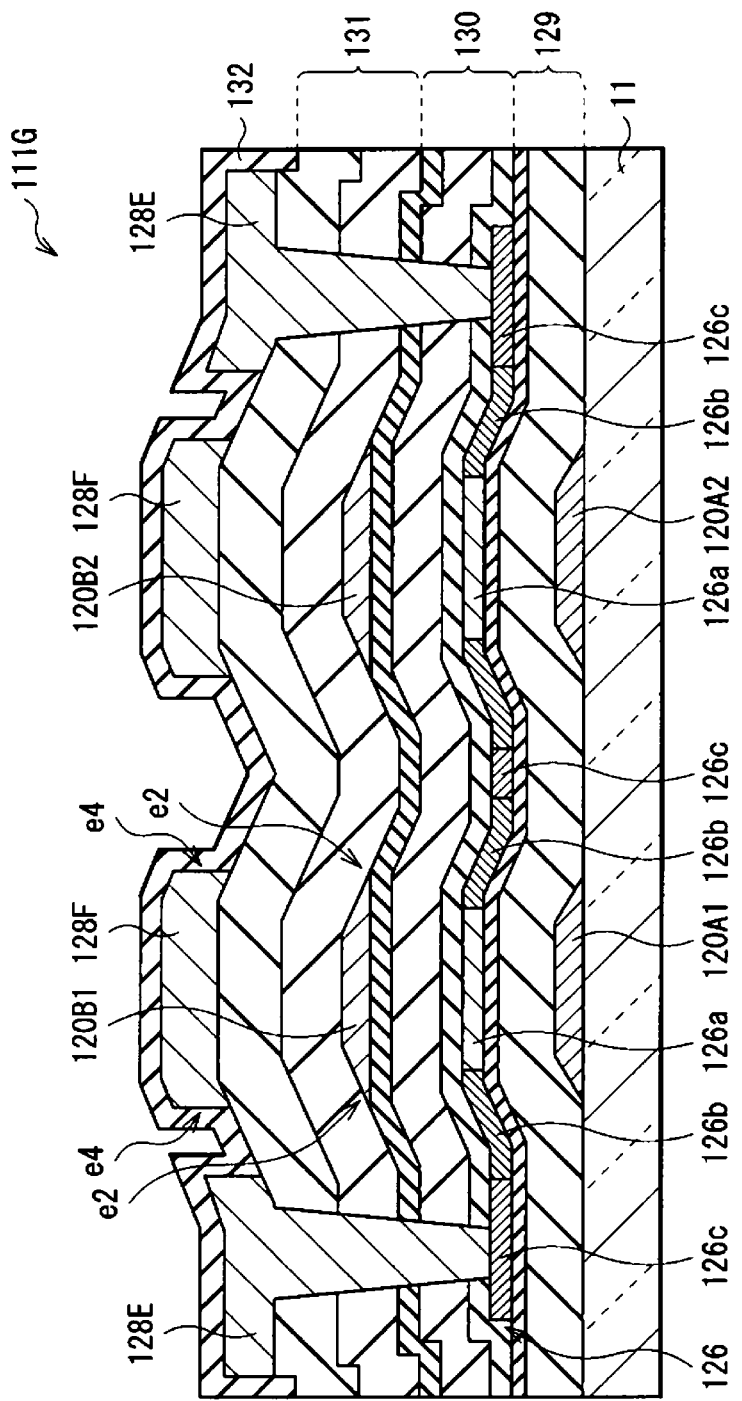
FIG. 22 is a cross-sectional diagram showing a rough configuration of a transistor according to fifth typical modification.

FIG. 22 is a cross-sectional diagram showing a rough configuration of a transistor 111G provided in accordance with fifth typical modification to serve as a fifth modified version. In the same way as the transistor 111B according to the first embodiment, the transistor 111G is included in the pixel circuit 12a of the pixel section 12 employed in the radioactive-ray imaging apparatus along with the photodiode 111A. In addition, the transistor 111G also has a dual-gate structure having the semiconductor layer 126 between two gate electrodes. On top of that, each of the second gate insulation film 129, the first gate insulation film 130, the first interlayer insulation film 131 and the second interlayer insulation film 132 includes a silicon-oxide film. Furthermore, a pair of source and drain electrodes 128E electrically connected to the semiconductor layer 126 are provided on the first interlayer insulation film 131.

Much like the third and fourth modified versions, the fifth modified version also has two dual-gate structures.

In the structure according to this typical modification, much like the second embodiment, shield electrode layers 128F electrically disconnected from the source and drain electrodes 128E are provided on the first interlayer insulation film 131. In this structure, however, the shield electrode layers 128F are provided to face their respective gate electrodes 120B1 and 120B2. It is to be noted that the positions of the edges e4 of the two shield electrode layers 128F are not limited to specific positions in particular as described above. However, it is nice to provide a desirable structure in which the shield electrode layers 128F are provided to cover the entire taper portions of the gate electrodes 120B1 and 120B2.

It is to be noted that, for example, the two shield electrode layers 128F can be electrically connected by making use of typically a wiring layer not shown in the figure to at least one of typically the gate electrodes 120A1 and 120A2 and the gate electrodes 120B1 and 120B2 in order to sustain the shield electrode layers 128F at the same electric potential as the gate electrodes 120A1 and 120A2 and the gate electrodes 120B1 and 120B2. As an alternative, the two shield electrode layers 128F can also be electrically disconnected from the gate electrodes 120A1 and 120A2 and the gate electrodes 120B1 and 120B2 so that the electric potential appearing at the two shield electrode layers 128F can be sustained at an arbitrary level set differently from the electric potentials appearing at the gate electrodes 120A1 and 120A2 and the gate electrodes 120B1 and 120B2. As another alternative, the two shield electrode layers 128F can also be sustained at the electric potential of the ground or can be put in a state of being floated.

As described above, also in the transistor 111G having such two dual-gate structures provided in parallel to each other, the shielding effect of the two shield electrode layers 128F allows the same effects as the second embodiment to be obtained.

Each of the third to fifth modified versions described above has a configuration in which the shield electrode layers are provided at locations horizontally symmetrical with respect to the two gate electrodes 120B1 and 120B2 laid out in parallel to each other. It is to be noted, however, that the locations of the shield electrode layers do not have to be horizontally symmetrical. For example, in a specific half of the transistor or for a specific one of the gate electrodes 120B1 and 120B2, a shield electrode layer is created by making use of a portion of the source and drain electrodes. In the other half of the transistor or for the other one of the gate electrodes 120B1 and 120B2, on the other hand, a shield electrode layer electrically disconnected from the source and drain electrodes is created separately. In addition, the widths (or the creation areas) of the shield electrode layers on the left and right sides may be different from each other. On top of that, the number of gate electrodes laid out in parallel to each other on the substrate or the number of second gate electrodes laid out in parallel to each other on the second gate insulation film is by no means limited to 1 or 2 as described above, but can be 3 or an integer greater than 3.

Sixth Typical Modification

Figure 23:
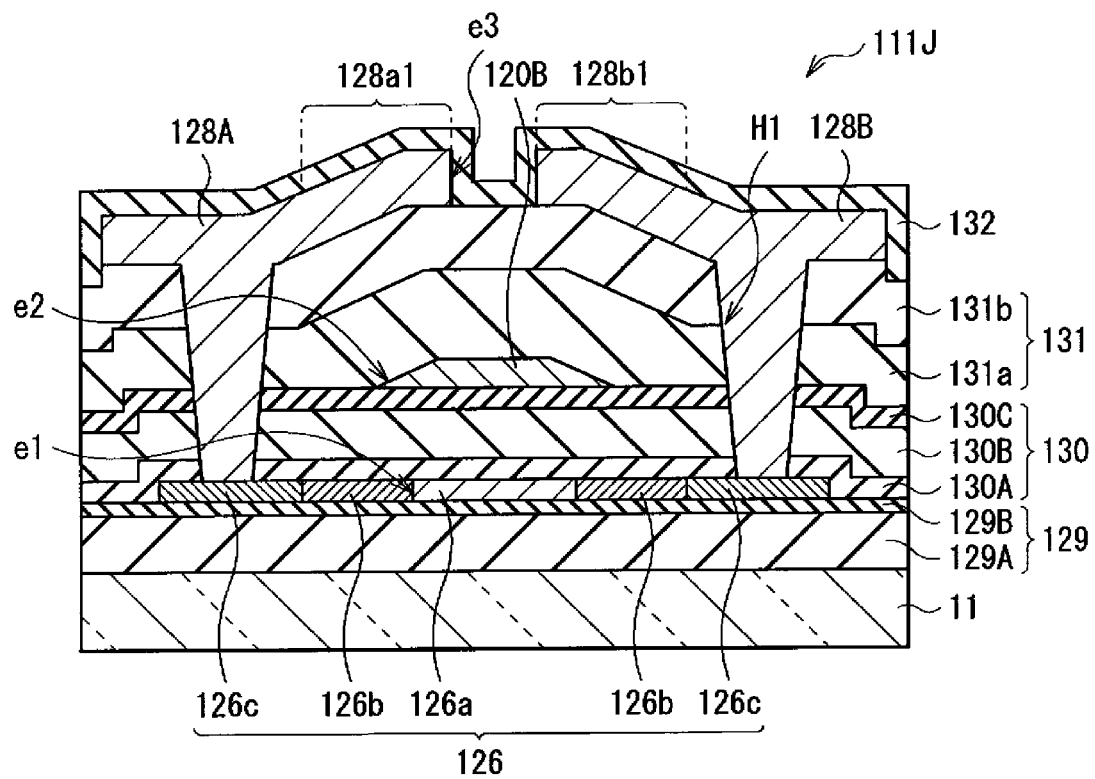
FIG. 23 is a cross-sectional diagram showing a rough configuration of a transistor according to sixth typical modification.

FIG. 23 is a diagram showing a cross-sectional structure of a transistor provided in accordance with sixth modification to serve as a transistor 111J according to a sixth modified version. In the same way as the transistor 111B according to the first embodiment, the transistor 111J is employed in the pixel circuit 12a of the pixel section 12, which is included in the radioactive-ray imaging apparatus, along with the photodiode 111A. In addition, each of the second gate insulation film 129, the first gate insulation film 130, the first interlayer insulation film 131 and the second interlayer insulation film 132 includes a silicon-oxide film. On top of that, a pair of source and drain electrodes 128A and 128B electrically connected to the semiconductor layer 126 are provided on the first interlayer insulation film 131.

However, the transistor 111J according to the sixth modified version has the so-called top gate structure. The transistor 111B according to this embodiment has a structure including only the gate electrode 120B which is one of the gate electrodes. In the same way as the transistor 111B, in the transistor 111J having such a gate electrode 120B, portions of the source and drain electrodes 128A and 128B also function as the shield electrode layers 128a1 and 128b1. Also in the case of the transistor 111J having such a top gate structure, the shield effects of the shield electrode layers 128a1 and 128b1 can be obtained.

It is to be noted that the gate electrode 120B in this modified version is a concrete example of the first gate electrode provided by the embodiment of the present disclosure.

In addition, in the same way as the first modified version, as shown in FIG. 24A, a transistor having the top gate structure can also be configured into a structure in which only a portion of the drain electrode 128c is provided to face one edge e2 of the gate electrode 120B so that the portion also functions as the shield electrode layer 128c1. On top of that, as shown in FIG. 24B, a transistor having the top gate structure can also be configured into a structure in which the drain electrode 128c is created by being further extended to positions covering both edges of the gate electrode 120B so that a portion of the drain electrode 128c also functions as the shield electrode layer 128c2. As an alternative shown in none of the figures, it is also possible to provide a structure in which, instead of a portion of the drain electrode 128c, a portion of the source electrode 128D also functions as a shield electrode layer.

Figure 25:
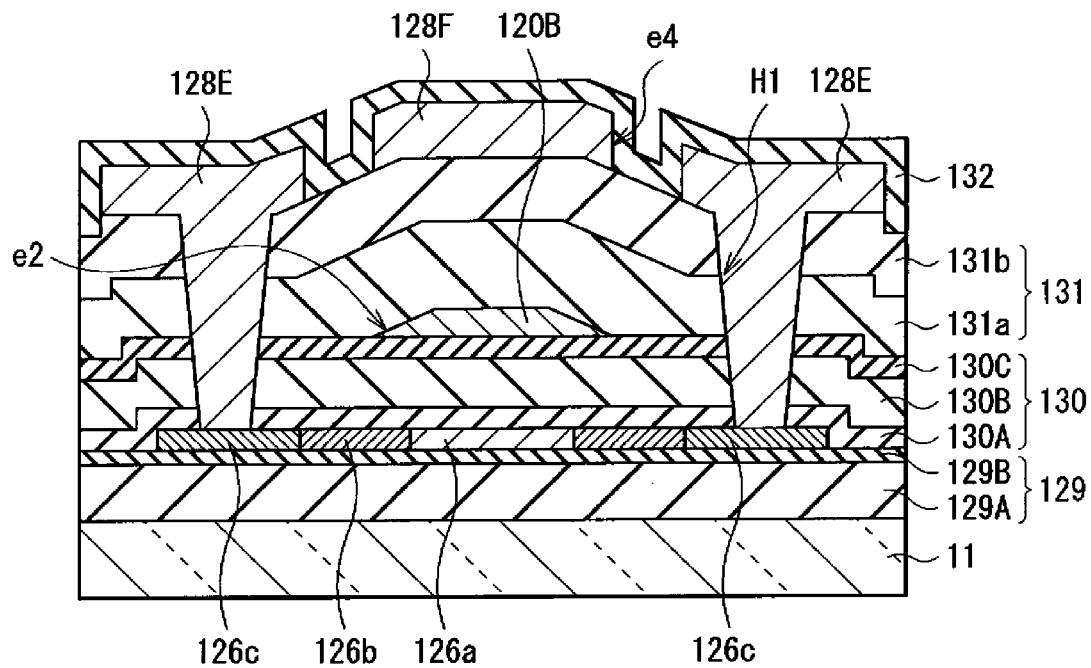
FIG. 25 is a cross-sectional diagram showing another rough configuration of the transistor shown in FIG. 23.

In addition, in the same way as the second embodiment, as shown in FIG. 25, it is also possible to provide a structure in which a shield electrode layer 128F electrically separated from the source/drain electrode 128E is provided on the first interlayer isolation film 131.

Seventh Typical Modification

Figure 26:
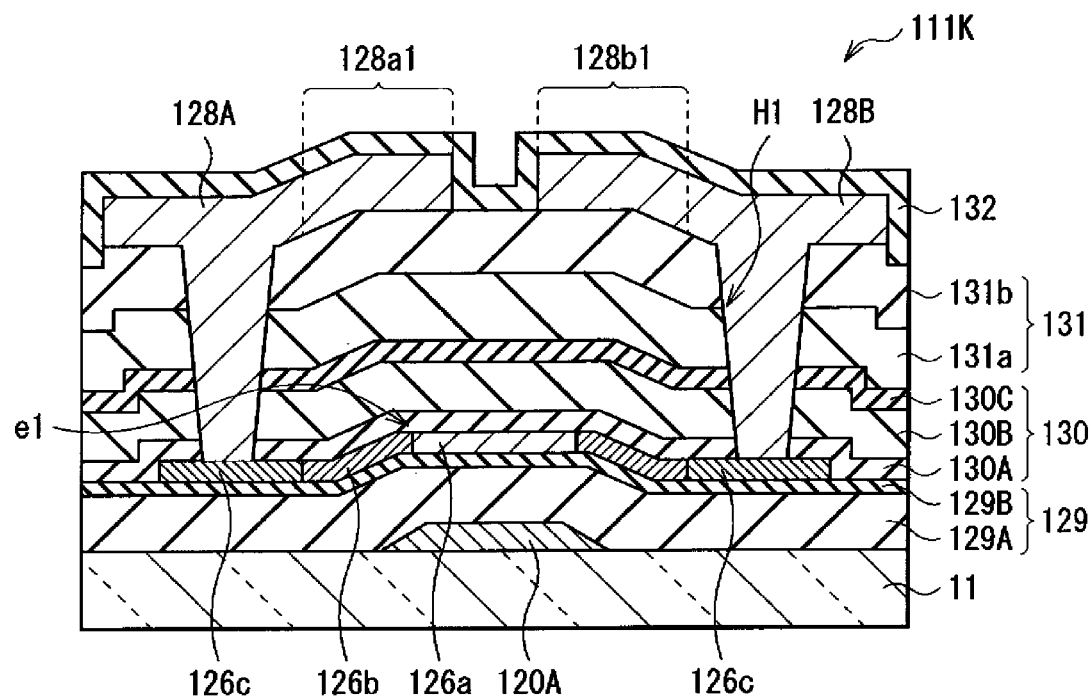
FIG. 26 is a cross-sectional diagram showing a rough configuration of a transistor according to seventh typical modification.

FIG. 26 is a diagram showing a cross-sectional structure of a transistor provided in accordance with seventh modification to serve as a transistor 111K according to a seventh modified version. In the same way as the transistor 111B according to the first embodiment, the transistor 111K is employed in the pixel circuit 12a of the pixel section 12, which is included in the radioactive-ray imaging apparatus, along with the photodiode 111A. In addition, each of the second gate insulation film 129, the first gate insulation film 130, the first interlayer insulation film 131 and the second interlayer insulation film 132 includes a silicon-oxide film. On top of that, a pair of source and drain electrodes 128A and 128B electrically connected to the semiconductor layer 126 are provided on the first interlayer insulation film 131.

However, the transistor 111K according to the seventh modified version has the so-called bottom gate structure. The transistor 111B according to this embodiment has a structure including only the gate electrode 120A which is one of the gate electrodes. In the same way as the transistor 111B, in the transistor 111K having such a gate electrode 120A, portions of the source and drain electrodes 128A and 128B also function as the shield electrode layers 128a1 and 128b1. Also in the case of the transistor 111K having such a bottom gate structure, the shield effects of the shield electrode layers 128a1 and 128b1 can be obtained.

It is to be noted that the gate electrode 120A in this modified version is a concrete example of the first gate electrode provided by the embodiment of the present disclosure.

Figure 27A:
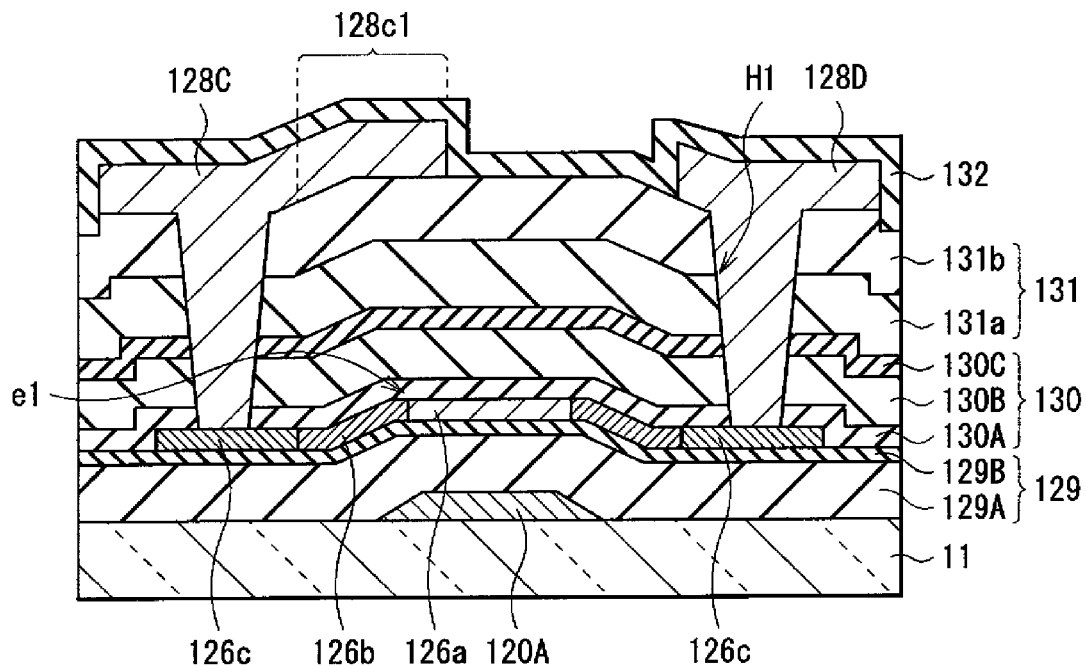
FIGS. 27A and 27B are cross-sectional diagrams showing another rough configuration of the transistor shown in FIG. 26.
Figure 27B:
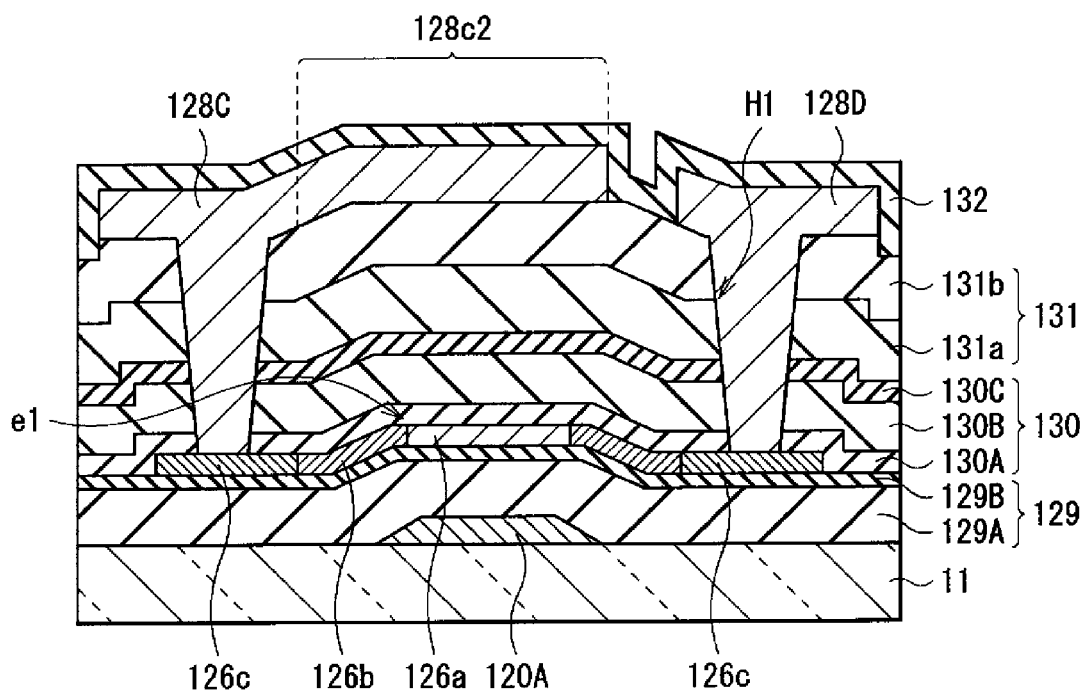

In addition, in the same way as the first modified version, as shown in FIG. 27A, a transistor having the bottom gate structure can also be configured into a structure in which only a portion of the drain electrode 128c is provided to face one edge e1 of the gate electrode 120A so that the portion also functions as the shield electrode layer 128c1. On top of that, as shown in FIG. 27B, the transistor having the bottom gate structure can also be configured into a structure in which the drain electrode 128c is created by being further extended to positions covering both edges of the gate electrode 120A so that a portion of the drain electrode 128c also functions as the shield electrode layer 128c2.

Figure 28:
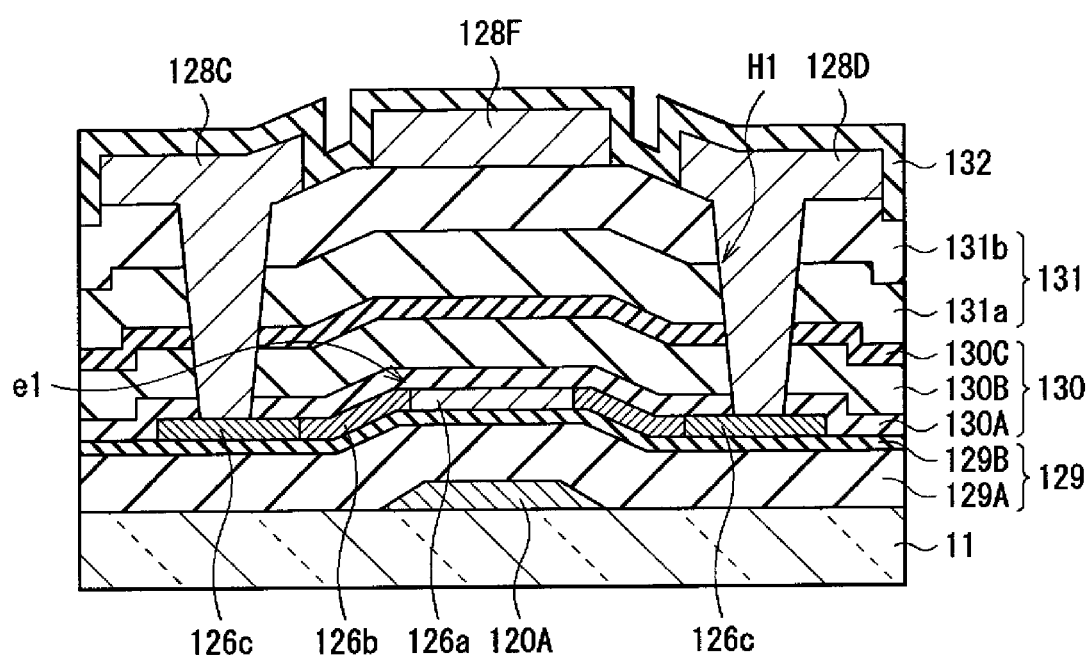
FIG. 28 is a cross-sectional diagram showing another rough configuration of the transistor shown in FIG. 26.

In addition, in the same way as the second embodiment, as shown in FIG. 28, it is also possible to provide a structure in which a shield electrode layer 128F electrically separated from the source/drain electrode 128E is provided on the first interlayer isolation film 131.

The following description explains eighth and ninth typical modifications which are each a modification implementing a modified version of the radioactive-ray imaging apparatus according to the embodiments of the present disclosure. It is to be noted that, in the description of the eighth and ninth typical modifications described below, each configuration element identical with its counterpart employed in the first and/or second embodiments described above is denoted by the same reference numeral as the counterpart and the explanation of the identical configuration element is properly omitted.

Eighth Typical Modification

Figure 29:
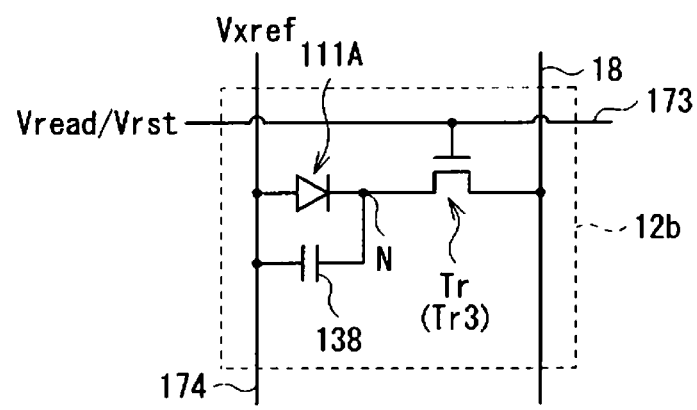
FIG. 29 is a diagram showing a typical example of a pixel driving circuit (also referred to as a passive driving circuit) according to eighth typical modification.

In the first embodiment, the pixel circuit provided in every pixel P is the pixel circuit 12a which adopts the active driving method. However, the pixel circuit provided in every pixel P can also be a pixel circuit 12b like one shown in FIG. 29 to serve as a pixel circuit which adopts the passive driving method. In a sixth modified version according to eighth typical modification, the unit pixel P is configured to include the photodiode 111A, a capacitor 138 and a transistor Tr which corresponds to the read transistor Tr3. The transistor Tr is connected between the accumulation node N and the vertical signal line 18. When the transistor Tr is turned on in response to the row scanning signal Vread, signal electric charge accumulated in the accumulation node N in accordance with the quantity of light incident to the photodiode 111A is output to the vertical signal line 18. It is to be noted that the transistor Tr (or Tr3) is any one of the transistors 111A to 111D which are provided by the embodiments described above and the modified versions also explained so far. As described above, the method for driving the pixel P is not limited to the active driving method adopted by the embodiments described above. That is to say, the method for driving the pixel P can also be the passive driving method as is the case with this sixth modified version.

Ninth Typical Modification

In the embodiments described above, an indirect-conversion-type FPD having the scintillator layer 114 provided on the pixel section 12 is taken as a typical radioactive-ray imaging apparatus. However, the radioactive-ray imaging apparatus according to the embodiments of the present disclosure can also be applied to an FPD of the direct conversion type. The FPD of the direct conversion type does not employ the scintillator layer 114 for carrying out a wavelength conversion process of converting a radioactive ray into a visible ray and the protection layer 115. Instead, the pixel section 12 is provided with a function for directly converting a radioactive ray into an electrical signal.

Figure 30:
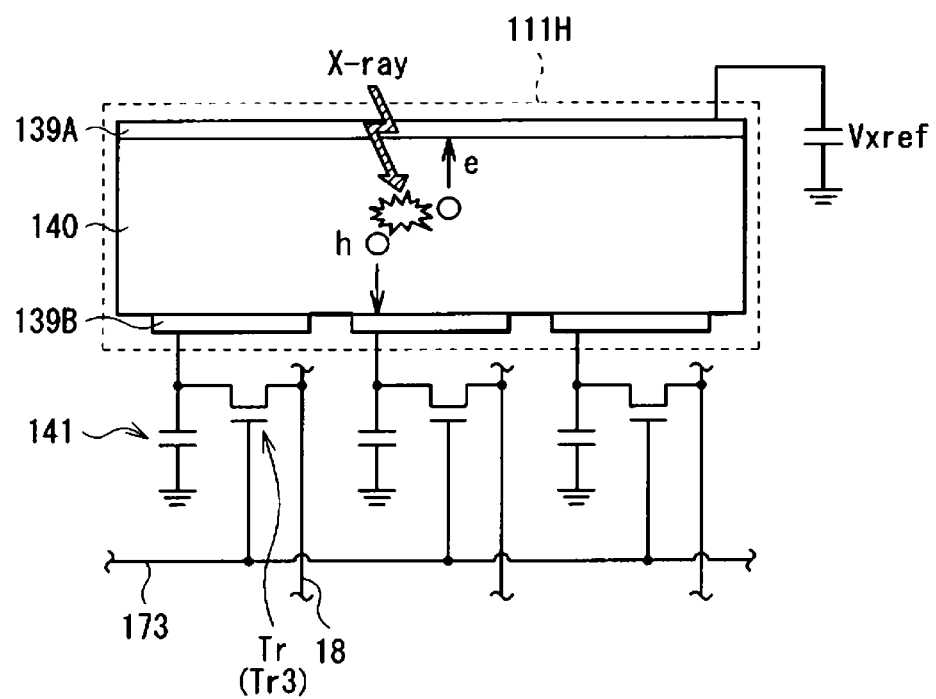
FIG. 30 is an explanatory model diagram to be referred to in description of a radioactive-ray imaging apparatus provided in accordance with ninth modification to serve as an apparatus having a direct conversion type.

FIG. 30 is an explanatory model diagram referred to in the following description of a radioactive-ray imaging apparatus provided in accordance with seventh modification to serve as a seventh modified version which is a radioactive-ray imaging apparatus having a direct conversion type. The seventh modified version includes a typical pixel section 12 making use of a pixel circuit 12b according to the sixth modified version adopting the passive driving method. In this seventh modified version, the pixel section 12 is configured to include a photoelectrical conversion device 111H, a capacitor 141 and a transistor Tr which corresponds to the read transistor Tr3. The photoelectrical conversion device 111H is a section for converting a radioactive ray into an electrical signal. The photoelectrical conversion device 111H has a direct conversion layer 140 provided typically between an upper electrode 139A and a pixel electrode 139B. The direct conversion layer 140 is made of typically an amorphous selenium semiconductor (an a-Se semiconductor) or a cadmium tellurium semiconductor (a CdTe semiconductor). It is to be noted that the transistor Tr (or Tr3) is any one of the transistors 111B to 111D which are provided by the embodiments described above and the modified versions also explained so far.

As described above, the transistors provided by the present disclosure can be applied to not only an FPD of the indirect conversion type, but also an FPD of the direct conversion type. In the case of the direct conversion type particularly, an incident radioactive ray directly hits the pixel section 12. Thus, the transistor is exposed more easily than the transistors according to the embodiments described above and the modified versions also explained so far. As a result, the effect to repress the shift of the threshold voltage Vth is also effective for the seventh modified version serving as a radioactive-ray imaging apparatus of the direct conversion type.

Typical Application

Figure 31:
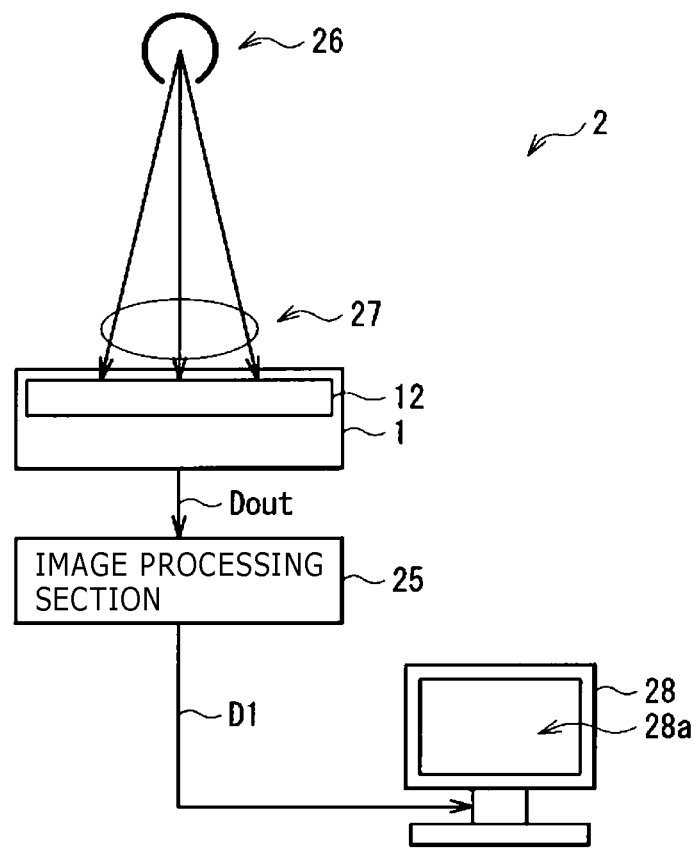
FIG. 31 is a model diagram showing the whole configuration of a radioactive-ray imaging display system serving as a typical application.

The transistors and the radioactive-ray imaging apparatus which are provided by the first and second embodiments as well as the first to fourth modified versions can be applied to a radioactive-ray imaging display system 2 like one shown in FIG. 31. As shown in the figure, the radioactive-ray imaging display system 2 includes the radioactive-ray imaging apparatus 1, an image processing section 25 and a display apparatus 28. In the radioactive-ray imaging display system 2 with such a configuration, on the basis of a radioactive ray radiated by a radioactive-ray source 26 to an imaging object 27, the radioactive-ray imaging apparatus 1 acquires image data Dout of the imaging object 27 and supplies the image data Dout to the image processing section 25. The image processing section 25 carries out predetermined image processing on the image data Dout received from the radioactive-ray imaging apparatus 1 and outputs image data (or display data) D1 obtained as a result of the image processing to the display apparatus 28. The display apparatus 28 has a monitor screen 28a for displaying an image based on the display data D1 received from the image processing section 25.

As described above, the radioactive-ray imaging apparatus 1 employed in the radioactive-ray imaging display system 2 is capable of acquiring an image of the imaging object 27 as an electrical signal. Thus, by supplying the acquired electrical signal to the display apparatus 28, the image of the imaging object 27 can be displayed. That is to say, the image of the imaging object 27 can be observed without making use of a radioactive-ray photograph film. In addition, it is also possible to cope with moving-picture imaging operations and moving-picture displaying operations.

The embodiments and the modified versions have been explained so far. However, the scope of the present disclosure is by no means limited to the embodiments and the modified versions. That is to say, a variety of changes can be further made to the embodiments and the modified versions. For example, the wavelength conversion material used for making the scintillator layer 114 employed in the embodiments and the modified versions is by no means limited those explained in the above descriptions. In other words, a variety of other fluorescent materials can also be used for making the scintillator layer 114.

In addition, each of the embodiments and the modified versions has a configuration in which the shield electrode layer as well as the source and drain electrodes are provided on the same layer. However, the shield electrode layer as well as the source and drain electrodes may be provided not necessarily on the same layer. That is to say, the shield electrode layer as well as the source and drain electrodes may also be provided on different layers.

On top of that, in the embodiments and the modified versions, each of the second gate insulation film 129, the first gate insulation film 130, the first interlayer insulation film 131 and the second interlayer insulation film 132 includes a silicon-oxide film. If at least one of the second gate insulation film 129, the first gate insulation film 130, the first interlayer insulation film 131 and the second interlayer insulation film 132 include a silicon-oxide film, however, it is possible to obtain the same effects as the disclosed present disclosure.

In addition, each of the embodiments and the modified versions has a configuration in which the second interlayer insulation film 132 made of silicon oxide is provided on the source and drain electrodes. However, the second interlayer insulation film 132 is not necessarily required. As an alternative, the second interlayer insulation film 132 can also be made of a material not including oxygen. A typical example of the material not including oxygen is silicon nitride. As explained earlier in the description of the first embodiment, from the viewpoint of the manufacturability of the photodiode 111A, however, it is desirable to provide a silicon-oxide film to serve as the second interlayer insulation film 132. In addition, the effect of the provided shield electrode layer is particularly effective for a silicon-oxide film provided above the shield electrode layer. A typical example of the silicon-oxide film provided above the shield electrode layer is the second interlayer insulation film 132.

Figure 32:
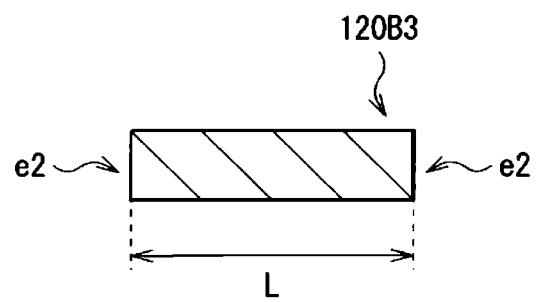
FIG. 32 is a cross-sectional model diagram showing another typical shape of a gate electrode.

On top of that, in each of the embodiments and the modified versions, a gate electrode having a taper portion on each of the side surfaces thereof is taken as a typical example of the second gate electrode according to the embodiments of the present disclosure. However, the second gate electrode is not necessarily required to have a taper portion on each of the side surfaces thereof. As shown in FIG. 32 for example, a second gate electrode 130B3 can also have side surfaces each forming a shape perpendicular to the surface of the substrate. In this case, the entire side surfaces of the second gate electrode 130B3 are each an edge of the second gate electrode 130B3.

In addition, in each of the embodiments and the modified versions, a film made of silicon oxide ($SiO_2$) is taken as a typical example of a silicon-oxide film according to the embodiments of the present disclosure. However, the silicon-oxide film can be any other film as far as the other film is a silicon compound film containing oxygen. For example, the silicon-oxide film can also be a film made of silicon oxynitride (SiON).

On top of that, in each of the embodiments and the modified versions, an N-type transistor made of N-MOS is taken as a typical example of the transistor according to the embodiments of the present disclosure. However, the transistor according to the embodiments of the present disclosure is by no means limited to the N-type transistor. For example, the transistor according to the embodiments of the present disclosure can also be a P-type transistor made of P-MOS.

In addition, in each of the embodiments and the modified versions, the photodiode 111A has a laminated structure built by creating a p-type semiconductor layer, an i-type semiconductor layer and an n-type semiconductor layer above the substrate in the same order as the order in which the p-type semiconductor layer, the i-type semiconductor layer and the n-type semiconductor layer are enumerated in this sentence. However, the photodiode 111A can also have a laminated structure built by creating an n-type semiconductor layer, an i-type semiconductor layer and a p-type semiconductor layer above the substrate in the same order as the order in which the n-type semiconductor layer, the i-type semiconductor layer and the p-type semiconductor layer are enumerated in this sentence.

On top of that, it is not necessary to employ all the configuration elements explained in the descriptions of each embodiment and each modified version which are provided by the present disclosure. Conversely, another layer can be added to each of the embodiments and the modified versions. For example, a protection film made of SiN or the like can also be created on the upper electrode 125.

It is to be noted that the present disclosure can be applied to transistors having configurations described in implementations 1 to 11 given below, a radioactive-ray imaging apparatus employing any of the transistors and a radioactive-ray imaging display system employing the radioactive-ray imaging apparatus.

1: A transistor including:

a semiconductor layer;

a first gate insulation film and a first interlayer insulation film which are provided on a specific surface side of the semiconductor layer;

a first gate electrode provided at a location between the first gate insulation film and the first interlayer insulation film;

an insulation film provided on the other surface side of the semiconductor layer;

source and drain electrodes provided by being electrically connected to the semiconductor layer; and a shield electrode layer provided in such a way that at least portions of the shield electrode layer face edges of the first gate electrode, wherein at least one of the first gate insulation film, the first interlayer insulation film and the insulation film include a silicon-oxide film.

2: The transistor according to implementation 1 further including a second gate electrode facing the first gate electrode through the semiconductor layer, wherein the second gate electrode, the insulation film, the semiconductor layer, the first gate insulation film, the first gate electrode and the first interlayer insulation film are sequentially created on a substrate in the same order as an order in which the second gate electrode, the insulation film, the semiconductor layer, the first gate insulation film, the first gate electrode and the first interlayer insulation film are enumerated in this sentence.

3: The transistor according to implementation 1 or 2 wherein the shield electrode layer is provided on the first interlayer insulation film.

4: The transistor according to implementation 3 wherein:
one or both of the source electrode and the drain electrode are provided on the first interlayer insulation film by being extended to areas facing the edges of the first gate electrode; and
portions included in the source electrode and the drain electrode to serve as portions facing the edges of the first gate electrode also function as the shield electrode layer.

5: The transistor according to implementation 3 wherein:
only the drain electrode is selected from the source electrode and the drain electrode to serve as an electrode to be provided on the first interlayer insulation film by being extended to an area facing the edge of the first gate electrode; and
a portion included in the drain electrode to serve as a portion facing the edge of the first gate electrode also functions as the shield electrode layer.

6: The transistor according to any of implementations 3 to 5, the transistor further having a second interlayer insulation film provided on the source electrode and the drain electrode,
wherein the second interlayer insulation film includes a silicon-oxide film.

7: The transistor according to any of implementations 3 to 5 wherein the source electrode, the drain electrode and the shield electrode layer are provided on the first interlayer insulation film by being electrically disconnected from each other.

8: The transistor according to implementation 7, the transistor further including a second interlayer insulation film provided on the source electrode, the drain electrode and the shield electrode layer,
wherein the second interlayer insulation film includes a silicon-oxide film.

9: The transistor according to implementation 7 or 8 wherein the shield electrode layer is held at a negative electric potential.

10: The transistor according to any of implementations 2 to 9 wherein a plurality of sets each consisting of the first and second gate electrodes are provided for a pair of the source and drain electrodes.

11: The transistor according to any of implementations 1 to 10 wherein the first gate electrode, the first gate insulation film, the semiconductor layer, the insulation film and the first interlayer insulation film are sequentially created on a substrate in the same order as an order in which the first gate electrode, the first gate insulation film, the semiconductor layer, the insulation film and the first interlayer insulation film are enumerated in this sentence.

12: The transistor according to any of implementations 1 to 11 wherein the insulation film, the semiconductor layer, the first gate insulation film, the first gate electrode and the first interlayer insulation film are sequentially created on a substrate in the same order as an order in which the insulation film, the semiconductor layer, the first gate insulation film, the first gate electrode and the first interlayer insulation film are enumerated in this sentence.

13: The transistor according to any of implementations 1 to 12 wherein the semiconductor layer is made of polysilicon.

14: The transistor according to any of implementations 1 to 13 wherein the silicon-oxide film is made of silicon oxide ($SiO_2$).

15: A radioactive-ray imaging apparatus including a pixel section having a transistor and a photoelectric conversion device, the transistor including:
a semiconductor layer;
a first gate insulation film and a first interlayer insulation film which are provided on a specific surface side of the semiconductor layer;
a first gate electrode provided at a location between the first gate insulation film and the first interlayer insulation film;
an insulation film provided on the other surface side of the semiconductor layer;
source and drain electrodes provided by being electrically connected to the semiconductor layer; and
a shield electrode layer provided in such a way that at least portions of the shield electrode layer face edges of the first gate electrode, wherein
at least one of the first gate insulation film, the first interlayer insulation film and the insulation film include a silicon-oxide film.

16: The radioactive-ray imaging apparatus according to implementation 15
wherein a wavelength conversion layer is provided on the pixel section to serve as a layer for changing the wavelength of an incident radioactive ray to a wavelength in a sensitive region of the photoelectric conversion device.

17: The radioactive-ray imaging apparatus according to implementation 15
wherein the photoelectric conversion device has a function for absorbing a radioactive ray and converting the radioactive ray into an electrical signal.

18: The radioactive-ray imaging display system employing a radioactive-ray imaging apparatus for acquiring an image based on radioactive rays and a display apparatus for displaying the image acquired by the radioactive-ray imaging apparatus wherein
the radioactive-ray imaging apparatus includes a pixel section having a transistor and a photoelectric conversion device, the transistor including:
a semiconductor layer;
a first gate insulation film and a first interlayer insulation film which are provided on a specific surface side of the semiconductor layer;
a first gate electrode provided at a location between the first gate insulation film and the first interlayer insulation film;
an insulation film provided on the other surface side of the semiconductor layer;
source and drain electrodes provided by being electrically connected to the semiconductor layer; and
a shield electrode layer provided in such a way that at least portions of the shield electrode layer face edges of the first gate electrode, and
at least one of the first gate insulation film, the first interlayer insulation film and the insulation film include a silicon-oxide film.

It should be understood by those skilled in the art that various modifications, combinations, sub-combinations and alterations may occur depending on design requirements and other factors in so far as they are within the scope of the appended claims or the equivalents thereof.

What is claimed is:

1. A transistor, comprising:
a semiconductor layer including a channel layer portion and a first layer portion disposed at each of two edges of the channel layer portion;
a first gate insulation film;
a first interlayer insulation film;
a gate electrode located between the first gate insulation film and the first interlayer insulation film;
a source electrode and a drain electrode, wherein the source electrode and the drain electrode are electrically connected to the semiconductor layer, and wherein at least one of the source electrode and the drain electrode include portions disposed directly on the first interlayer insulation film facing at least one taper portion of the gate electrode;

a shield electrode layer portion disposed directly on the first interlayer insulation film between the source electrode and the drain electrode, wherein the shield electrode layer portion is electrically disconnected from the gate electrode such that an electric potential of the shield electrode layer portion is different from an electric potential of the gate electrode; and a second interlayer insulation film disposed directly on the source electrode, the drain electrode, and the shield electrode layer portion, wherein a first concavity portion in the second interlayer insulation film is located between the source electrode and the shield electrode layer portion and a second concavity portion in the second interlayer insulation film is located between the drain electrode and the shield electrode layer portion, wherein a shielding effect of the shield electrode layer portion reduces an influence of a positive electric charge accumulated in the second interlayer insulation film on the at least one of the two edges of the channel layer portion.

2. The transistor according to claim 1, further including a second gate electrode facing the gate electrode through the semiconductor layer, wherein the second gate electrode, a second gate insulation film, the semiconductor layer, the first gate insulation film, the gate electrode, and the first interlayer insulation film are sequentially created on a substrate in the same order as an order in which the second gate electrode, the second gate insulation film, the semiconductor layer, the first gate insulation film, the gate electrode, and the first interlayer insulation film are enumerated in this sentence.

3. The transistor according to claim 1, wherein the second interlayer insulation film includes a silicon-oxide film.

4. The transistor according to claim 1, wherein the shield electrode layer portion is held at a negative electric potential.

5. The transistor according to claim 2, wherein a plurality of sets, each set including of the first and the second gate electrodes, are provided between the source electrode and the drain electrode.

6. The transistor according to claim 1, wherein a second gate insulation film, the semiconductor layer, the first gate insulation film, the gate electrode, and the first interlayer insulation film are sequentially created on a substrate in the same order as an order in which the second gate insulation film, the semiconductor layer, the first gate insulation film, the gate electrode, and the first interlayer insulation film are enumerated in this sentence.

7. The transistor according to claim 1, wherein the semiconductor layer includes polysilicon.

8. The transistor according to claim 1, wherein at least one of the gate insulation film and the first interlayer insulation film include a silicon-oxide film.

9. The transistor according to claim 8, wherein the silicon-oxide film includes silicon oxide ($SiO_2$).

10. A radioactive-ray imaging apparatus comprising a pixel section having a transistor and a photoelectric conversion device, the transistor including:

a semiconductor layer including a channel layer portion and a first layer portion disposed at each of two edges of the channel layer portion;

a first gate insulation film;

a first interlayer insulation film;

a gate electrode located between the first gate insulation film and the first interlayer insulation film;

a source electrode and a drain electrode, wherein the source electrode and the drain electrode are electrically connected to the semiconductor layer, and wherein at least one of the source electrode and the drain electrode include portions disposed directly on the first interlayer insulation film facing at least one taper portion of the gate electrode;

a shield electrode layer portion disposed directly on the first interlayer insulation film between the source electrode and the drain electrode, wherein the shield electrode layer portion is electrically disconnected from the gate electrode such that an electric potential of the shield electrode layer portion is different from an electric potential of the gate electrode; and a second interlayer insulation film disposed directly on the source electrode, the drain electrode, and the shield electrode layer portion, wherein a first concavity portion in the second interlayer insulation film is located between the source electrode and the shield electrode layer portion and a second concavity portion in the second interlayer insulation film is located between the drain electrode and the shield electrode layer portion, wherein a shielding effect of the shield electrode layer portion reduces an influence of a positive electric charge accumulated in the second interlayer insulation film on the at least one of the two edges of the channel layer portion.

11. The radioactive-ray imaging apparatus according to claim 10, wherein a wavelength conversion layer is provided on the pixel section for changing the wavelength of an incident radioactive ray to a wavelength in a sensitive region of the photoelectric conversion device.

12. The radioactive-ray imaging apparatus according to claim 10, wherein the photoelectric conversion device absorbs a radioactive ray and converts the radioactive ray into an electrical signal.

13. A radioactive-ray imaging display system employing a radioactive-ray imaging apparatus for acquiring an image based on radioactive rays and a display apparatus for displaying the image acquired by the radioactive-ray imaging apparatus, wherein the radioactive-ray imaging apparatus includes a pixel section having a transistor and a photoelectric conversion device, the transistor comprising:

a semiconductor layer including a channel layer portion and a first layer portion disposed at each of two edges of the channel layer portion;

a first gate insulation film;

a first interlayer insulation film;

a gate electrode located between the first gate insulation film and the first interlayer insulation film;

a source electrode and a drain electrode, wherein the source electrode and the drain electrode are electrically connected to the semiconductor layer, and wherein at least one of the source electrode and the drain electrode include portions disposed directly on the first interlayer insulation film facing at least one taper portion of the gate electrode;

a shield electrode layer portion disposed directly on the first interlayer insulation film between the source electrode and the drain electrode, wherein the shield electrode layer portion is electrically disconnected from the gate electrode such that an electric potential of the shield electrode layer portion is different from an electric potential of the gate electrode; and a second interlayer insulation film disposed directly on the source electrode, the drain electrode, and the shield electrode layer portion, wherein a first concavity portion in the second interlayer insulation film is located between the source electrode and the shield electrode layer portion and a second concavity portion in the second interlayer insulation film is located between the drain electrode and the shield electrode layer portion, wherein a shielding effect of the shield electrode layer portion reduces an influence of a positive electric charge accumulated in the second interlayer insulation film on the at least one of the two edges of the channel layer portion.

* * * * *